(12) United States Patent
Kang et al.

(10) Patent No.: US 11,809,660 B2
(45) Date of Patent: Nov. 7, 2023

(54) ELECTRONIC DEVICE

(71) Applicant: Samsung Display Co., Ltd., Yongin-si (KR)

(72) Inventors: Jina Kang, Hwaseong-si (KR); Jinwoo Kim, Hwaseong-si (KR); Changbum Kim, Pyeongtaek-si (KR); Byeongkyu Jeon, Busan (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/960,558

(22) Filed: Oct. 5, 2022

(65) Prior Publication Data

US 2023/0114072 A1    Apr. 13, 2023

(30) Foreign Application Priority Data

Oct. 13, 2021 (KR) .......... 10-2021-0135420

(51) Int. Cl.
| | |
|---|---|
| *G06F 3/041* | (2006.01) |
| *G06F 3/044* | (2006.01) |
| *G09G 3/3275* | (2016.01) |
| *G09G 3/3266* | (2016.01) |
| *H10K 59/40* | (2023.01) |

(52) U.S. Cl.
CPC .......... *G06F 3/04184* (2019.05); *G06F 3/044* (2013.01); *G06F 3/0441* (2019.05); *G06F 3/0442* (2019.05); *G09G 3/3266* (2013.01); *G09G 3/3275* (2013.01); *H10K 59/40* (2023.02); *G06F 2203/04106* (2013.01); *G09G 2310/0278* (2013.01)

(58) Field of Classification Search
CPC ......... G09G 2310/0278; G09G 3/3266; G09G 3/3275; G06F 3/044; G06F 3/0441; G06F 3/0442; G06F 2203/04106; G06F 3/04184; H10K 59/40
See application file for complete search history.

(56) References Cited

U.S. PATENT DOCUMENTS

| | | |
|---|---|---|
| 10,359,885 B2 | 7/2019 | Brahma et al. |
| 10,444,870 B2 | 10/2019 | Kadowaki et al. |
| 10,942,598 B2 | 3/2021 | Koike et al. |
| (Continued) | | |

FOREIGN PATENT DOCUMENTS

KR    10-2017-0134519 A    12/2017

*Primary Examiner* — William Boddie
*Assistant Examiner* — Saifeldin E Elnafia
(74) *Attorney, Agent, or Firm* — Lewis Roca Rothgerber Christie LLP

(57) ABSTRACT

An electronic device includes a display panel, an input sensor, a panel driver, and a sensor controller. The panel driver drives the display panel at a first operating frequency in a first driving mode and drives the display panel at a second operating frequency lower than the first operating frequency in a second driving. The display panel displays the image in units of first driving frames in the first driving mode and displays the image in units of second driving frames in the second driving mode. The sensor controller transmits a first mode uplink signal to the input sensor in a first scheme in the first driving mode and transmits a second mode uplink signal to the input sensor in a second scheme different from the first scheme in the second driving mode.

22 Claims, 28 Drawing Sheets

(56) References Cited

U.S. PATENT DOCUMENTS

| | | | |
|---|---|---|---|
| 2016/0092010 A1* | 3/2016 | Agarwal | G06F 3/0412 |
| | | | 345/173 |
| 2018/0224961 A1* | 8/2018 | Yamamoto | G06F 3/0445 |
| 2020/0050339 A1* | 2/2020 | Choi | G06F 3/0383 |
| 2020/0073530 A1* | 3/2020 | Kim | G06F 3/041661 |
| 2021/0333975 A1* | 10/2021 | Miyamoto | G06F 3/03545 |
| 2022/0027010 A1* | 1/2022 | Yuan | G06F 3/0441 |

* cited by examiner

ELECTRONIC DEVICE

CROSS-REFERENCE TO RELATED APPLICATIONS

The present application claims priority to and the benefit of Korean Patent Application No. 10-2021-0135420 filed on Oct. 13, 2021, in the Korean Intellectual Property Office, the entire disclosure of which is incorporated herein by reference.

BACKGROUND

1. Field

Aspects of some embodiments of the present disclosure described herein relate to an electronic device.

2. Description of the Related Art

An electronic device may detect external inputs applied from the outside of the electronic device. The external input may be a user input. The user input may include various types of external inputs from various sources such as, for example, a part of the user's body, light, heat, a pen, a stylus, proximity, pressure, or the like. The electronic device may recognize coordinates of the pen using an electromagnetic resonance (EMR) scheme or may recognize coordinates of the pen using an active electrostatic (AES) scheme.

The above information disclosed in this Background section is only for enhancement of understanding of the background and therefore the information discussed in this Background section does not necessarily constitute prior art.

SUMMARY

Aspects of some embodiments of the present disclosure described herein relate to an electronic device, and for example, to an electronic device with relatively improved display quality.

Aspects of some embodiments of the present disclosure include an electronic device for enhancing a phenomenon in which display quality is degraded due to noise associated with an input sensor.

According to some embodiments, an electronic device may include a display panel that displays an image, an input sensor on the display panel and to operate in a first mode for detecting a first input by an input device or a second mode for detecting a second input different from the first input, a panel driver that drives the display panel at a first operating frequency in a first driving mode and drives the display panel at a second operating frequency lower than the first operating frequency in a second driving mode, and a sensor controller that controls driving of the input sensor.

According to some embodiments, the display panel may display the image in units of first driving frames in the first driving mode and may display the image in units of second driving frames in the second driving mode.

According to some embodiments, the sensor controller may transmit a first mode uplink signal for synchronization with the input device to the input sensor in a first scheme in the first driving mode and may transmit a second mode uplink signal for synchronization with the input device to the input sensor in a second scheme different from the first scheme in the second driving mode.

According to some embodiments, an electronic device may include a display panel that displays an image, an input sensor on the display panel to operate in a first mode for detecting a first input by an input device or a second mode for detecting a second input different from the first input, a panel driver that drives the display panel at a first operating frequency in a first driving mode and drives the display panel at a second operating frequency lower than the first operating frequency in a second driving mode, and a sensor controller that controls driving of the input sensor.

According to some embodiments, the display panel may display the image in units of first driving frames in the first driving mode and may display the image in units of second driving frames in the second driving mode. The second driving frames may include k write frames and j holding frames. Herein the k is an even number of 2 or more.

According to some embodiments, an electronic device may include a display panel that displays an image at a first operating frequency in a first driving mode and displays the image at a second operating frequency lower than the first operating frequency in a second driving mode, an input sensor on the display panel to operate in a first mode for detecting a first input by an input device or a second mode for detecting a second input different from the first input, a data driver that outputs data signals to the display panel, a scan driver that outputs scan signals to the display panel, and a sensor controller that controls driving of the input sensor and transmits an uplink signal for synchronization with the input device during an uplink interval.

According to some embodiments, the display panel may display the image in units of first driving frames in the first driving mode and may display the image in units of second driving frames in the second driving mode. The second driving frames may include a first sub-frame and a plurality of second sub-frames. At least one of the plurality of second sub-frames may include an active interval where the scan driver is activated and an inactive interval where the scan driver is deactivated.

BRIEF DESCRIPTION OF THE DRAWINGS

The above and other characteristics and features of the present disclosure will become more apparent by describing in more detail aspects of some embodiments thereof with reference to the accompanying drawings.

DETAILED DESCRIPTION

Figure 1:
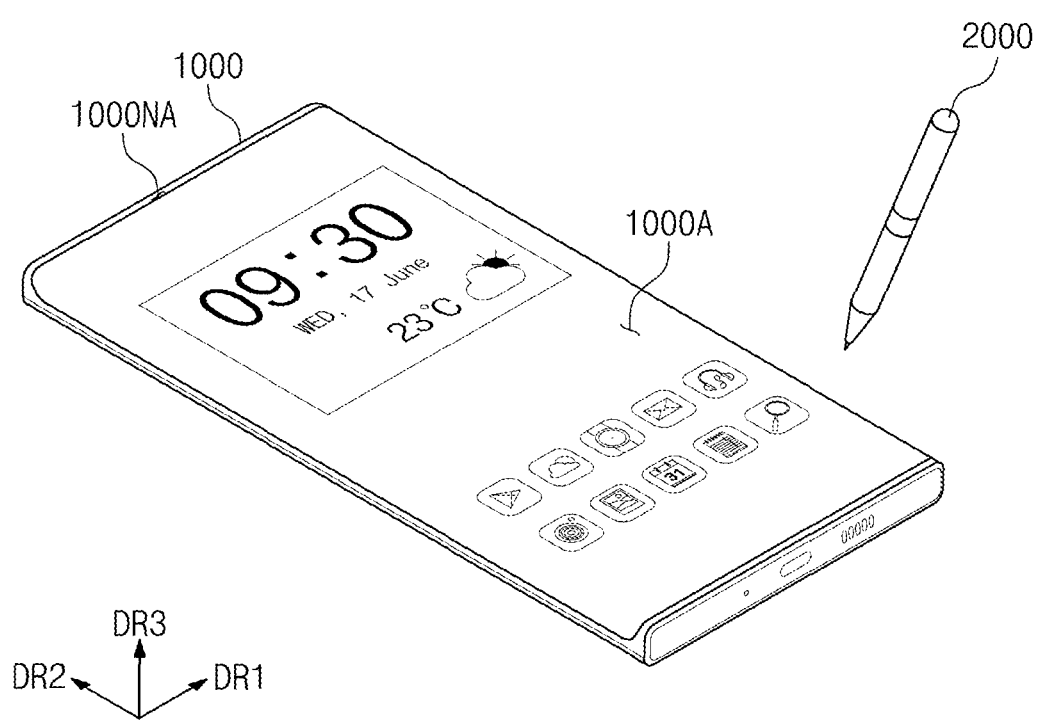
FIGS. 1 and 2 are perspective views illustrating an electronic device and an input device according to some embodiments of the present disclosure.

In the specification, the expression that a first component (or region, layer, part, portion, etc.) is "on", "connected with", or "coupled with" a second component means that the first component is directly on, connected with, or coupled with the second component or means that a third component is interposed therebetween.

Like reference numerals refer to like elements. Also, in the drawings, the thicknesses, the ratios, and the dimensions of the elements may be exaggerated for effective description of technical contents. The expression "and/or" includes one or more combinations which associated components are capable of defining.

Although the terms "first," "second," etc. may be used herein in describing various elements, such elements should not be construed as being limited by these terms. These terms are only used to distinguish one element from another element. For example, a first element could be termed a second element without departing from the scope of the claims of the present disclosure, and similarly a second element could be termed a first element. The singular forms are intended to include the plural forms unless the context clearly indicates otherwise.

Also, the terms "under", "below", "on", "above", etc. are used to describe the correlation of components illustrated in drawings. These terms are relative concepts and are described on the basis of the directions shown in the drawings.

It will be further understood that the terms "comprises", "includes", "have", etc. specify the presence of stated features, numbers, steps, operations, elements, components, or a combination thereof but do not preclude the presence or addition of one or more other features, numbers, steps, operations, elements, components, or a combination thereof.

Unless otherwise defined, all terms (including technical terms and scientific terms) used in the specification have the same meaning as commonly understood by one skilled in the art to which the present disclosure belongs. Furthermore, terms such as terms defined in the dictionaries commonly used should be interpreted as having a meaning consistent with the meaning in the context of the related technology, and should not be interpreted in ideal or overly formal meanings unless explicitly defined herein.

Hereinafter, aspects of some embodiments of the present disclosure will be described in more detail with reference to accompanying drawings.

FIG. 1 is a perspective view illustrating an electronic device and an input device according to some embodiments of the present disclosure.

Referring to FIG. 1, an electronic device 1000 may be a device activated according to an electrical signal. For example, the electronic device 1000 may be, but is not limited to, a mobile phone, a tablet, a car navigation system, a game console, a wearable device, or any other suitable electronic device having display functionality. FIG. 1 illustrates that the electronic device 1000 is a mobile phone.

An active area 1000A and a non-active area 1000NA may be defined in the electronic device 1000. The electronic device 1000 may display images at the active area 1000A. The active area 1000A may include a surface defined by a first direction DR1 and a second direction DR2. The non-active area 1000NA may surround the active area 1000A.

The thickness direction of the electronic device 1000 may be parallel to a third direction DR3 intersecting or normal with respect to a plane defined by the first direction DR1 and the second direction DR2. Thus, front surfaces (or upper surfaces) and rear surfaces (or lower surfaces) of members making up the electronic device 1000 may be defined with respect to the third direction DR3.

The electronic device 1000 may detect inputs applied from the outside of the electronic device 1000. The external inputs may include various types of external inputs such as a part of the body of a user, light, heat, pressure, etc.

The electronic device 1000 shown in FIG. 1 may detect an input by a touch of the user and an input by an input device 2000. The input device 2000 may refer to a device except for the body of the user. The input by the input device 2000 may be referred to as a first input, and the input by the touch of the user may be referred to as a second input. For example, the input device 2000 may be an active pen, a stylus pen, a touch pen, or an electronic pen. Hereinafter, the case where the input device 2000 is the active pen will be described as an example.

The electronic device 1000 and the input device 2000 may perform bidirectional communication. The electronic device 1000 may provide an uplink signal to the input device 2000. For example, the uplink signal may include, but is not particularly limited to, a synchronization signal or information of the electronic device 1000. The input device 2000 may provide a downlink signal to the electronic device 1000.

The downlink signal may include a synchronization signal or state information of the input device 2000. For example, the downlink signal may include, but is not particularly limited to, coordinate information of the input device 2000, battery information of the input device 2000, slope information of the input device 2000, various pieces of information stored in the input device 2000, and/or the like. The uplink signal and the downlink signal will be described below.

Figure 2:
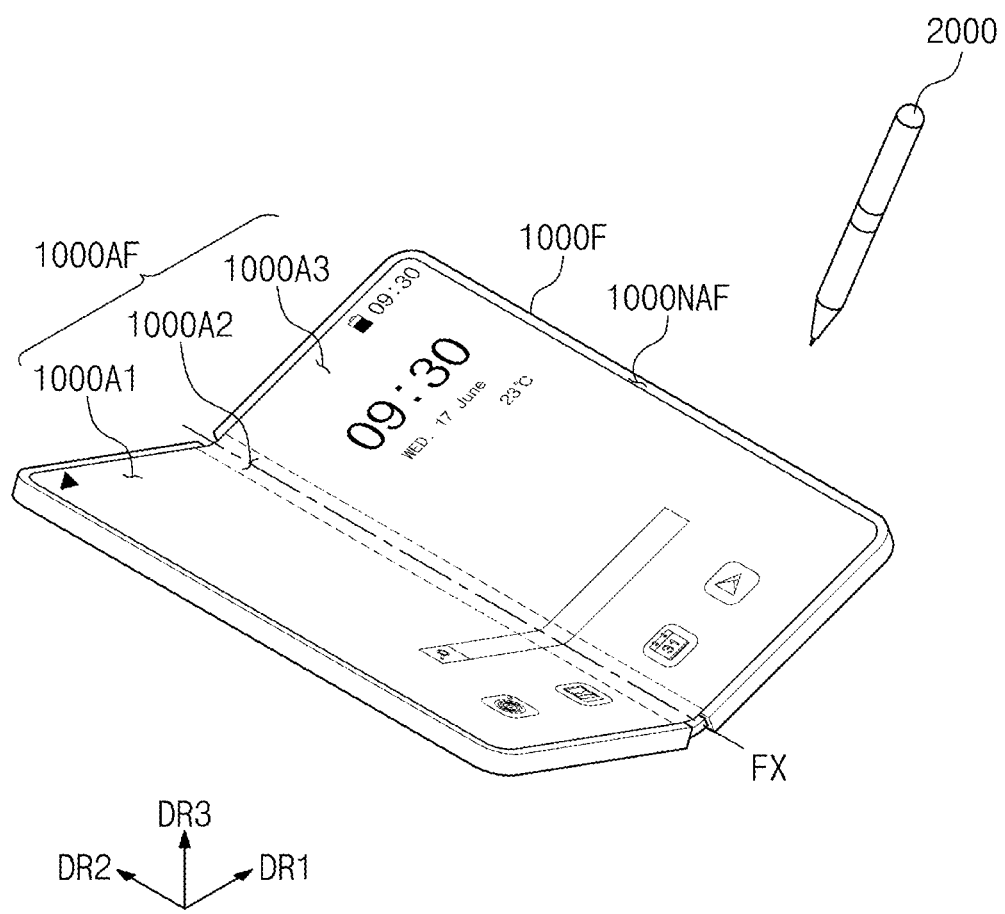

FIG. 2 is a perspective view illustrating an electronic device and an input device according to some embodiments of the present disclosure. In describing FIG. 2, the same reference numerals are assigned to the same components described with reference to FIG. 1, and thus some description thereof may be omitted.

Referring to FIG. 2, an electronic device 1000F (e.g., a foldable electronic device similar to, or the same as, the electronic device 1000 illustrated in FIG. 1) may display images at an active area 1000AF. FIG. 2 illustrates that the electronic device 1000F is folded at a certain angle. In a state where the electronic device 1000F is unfolded, the active area 1000AF may include a plane defined by a first direction DR1 and a second direction DR2. The electronic device 1000F may further include a non-active area 1000NAF adjacent to the active area 1000AF.

The active area 1000AF may include a first active area 1000A1, a second active area 1000A2, and a third active area 1000A3. The first active area 1000A1, the second active area 1000A2, and the third active area 1000A3 may be sequentially defined in the first direction DR1. The second active area 1000A2 may be bent about a folding axis FX extending along the second direction DR2. Thus, the first active area 1000A1 and the third active area 1000A3 may be referred to as non-folding areas, and the second active area 1000A2 may be referred to as a folding area.

When the electronic device 1000F is folded, the first active area 1000A1 and the third active area 1000A3 may face each other. Thus, in a state where the electronic device 1000F is fully folded, the active area 1000AF may not be exposed to the outside, which may be referred to as "in-folding". However, this is merely illustrative, and the operation of the electronic device 1000F is not limited thereto.

For example, according to some embodiments of the present disclosure, when the electronic device 1000F is folded, the first active area 1000A1 and the third active area 1000A3 may be opposite to each other. Thus, in a state where the electronic device 1000F is folded, the active area 1000AF may be exposed to the outside, which may be referred to as "out-folding".

The electronic device 1000F may perform only any one of an in-folding operation or an out-folding operation. Alternatively, the electronic device 1000F may perform both the in-folding operation and the out-folding operation. In this case, the same area of the electronic device 1000F, for example, the second active area 1000A2 may be folded inwardly and outwardly.

One folding area and two non-folding areas are illustrated as an example in FIG. 2, but the number of folding areas and the number of non-folding areas are not limited thereto. For example, the electronic device 1000F may include a plurality of non-folding areas, the number of which is greater than two, and a plurality of folding areas arranged between non-folding areas adjacent to each other. For example, according to some embodiments, the electronic device 1000F may include three or more non-folding areas, and two or more folding areas arranged between the non-folding areas.

The case where the folding axis FX extends in the second direction DR2 is illustrated as an example, but embodiments according to the present disclosure are not limited thereto. For example, the folding axis FX may extend in a direction parallel to the first direction DR1. In this case, the first active area 1000A1, the second active area 1000A2, and the third active area 1000A3 may be sequentially arranged along the second direction DR2.

The active area 1000AF may be overlapped with at least one electronic module. For example, the at least one electronic module may include a camera module, a proximity illumination sensor, and the like. The at least one electronic module may receive an external input delivered through the active area 1000AF or may provide an output through the active area 1000AF. A portion of the active area 1000AF overlapped with the camera module, the proximity illumination sensor, and the like may have transmissivity higher than another portion of the active area 1000AF. Thus, an area where a plurality of electronic modules will be arranged is not provided to the non-active area 1000NAF. As a result, the ratio of the area of the active area 1000AF to the front of the electronic device 1000F may increase, and the ratio of the area of the non-active area 1000NAF to the front of the electronic device 1000F may decrease.

The electronic device 1000F and an input device 2000 may perform bidirectional communication. The electronic device 1000F may provide an uplink signal to the input device 2000. The input device 2000 may provide a downlink signal to the electronic device 1000F. The electronic device 1000F may detect coordinates of the input device 2000 using a signal provided from the input device 2000.

Figure 3:
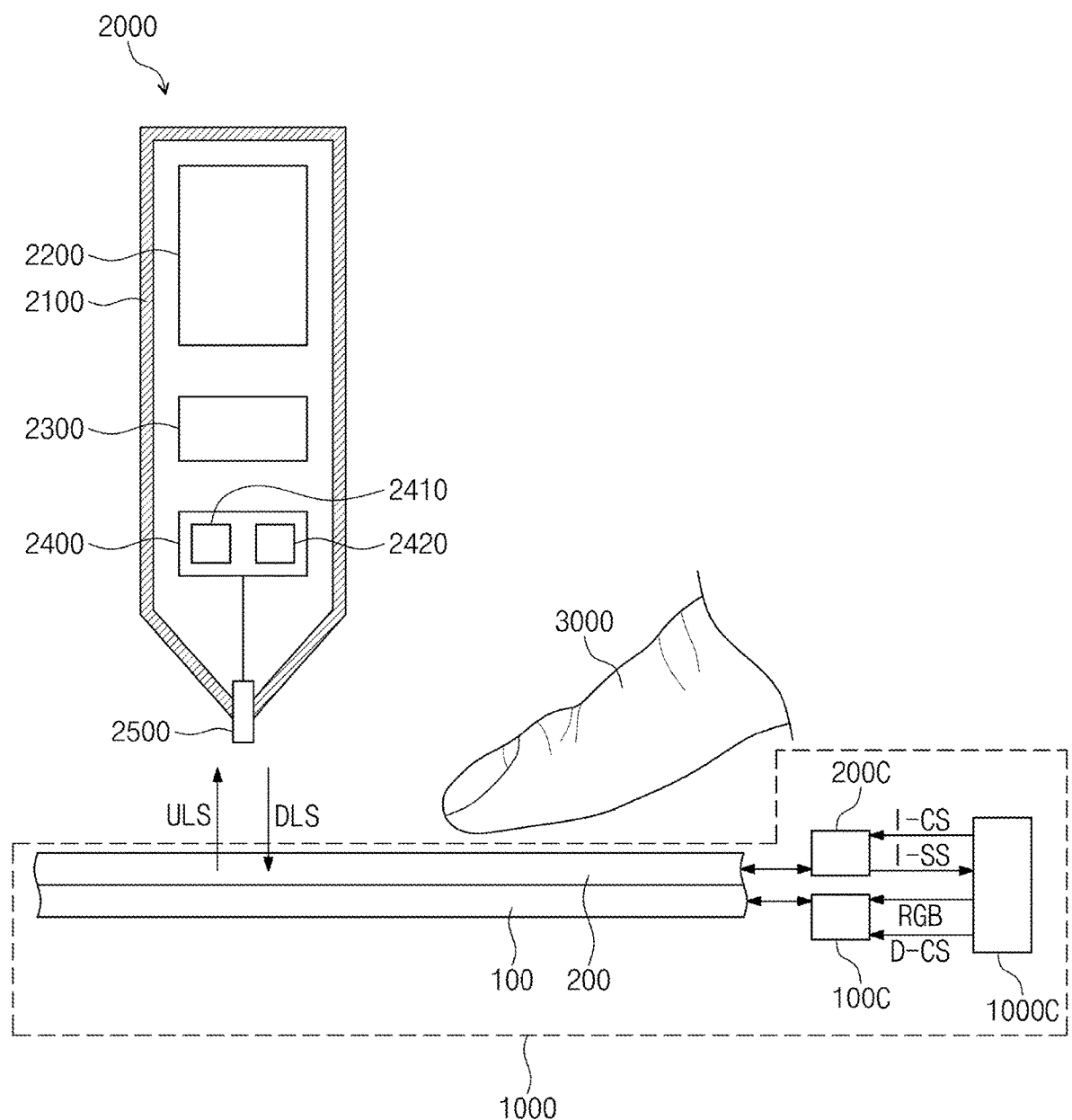
FIG. 3 is a block diagram schematically illustrating an electronic device and an input device according to some embodiments of the present disclosure.

FIG. 3 is a block diagram schematically illustrating an electronic device and an input device according to some embodiments of the present disclosure.

Referring to FIG. 3, an electronic device 1000 may include a display panel 100, an input sensor 200, a panel driver 100C, a sensor controller 200C, and a main controller 1000C.

The display panel 100 may be a component which generates or displays images. The display panel 100 may be a light emitting display panel. For example, the display panel 100 may be an organic light emitting display panel, an inorganic light emitting display panel, a quantum dot display panel, a micro-LED display panel, or a nano-LED display panel.

The input sensor 200 may be located on the display panel 100. The input sensor 200 may sense an external input applied from the outside. The input sensor 200 may sense a first input by the input device 2000 and a second input by a body (e.g., a finger, etc.) 3000 of the user.

The main controller 1000C may control the overall operation of the electronic device 1000. For example, the main controller 1000C may control operations of the panel driver 100C and the sensor controller 200C. The main controller 1000C may include at least one microprocessor, and the main controller 1000C may be referred to as a host.

The panel driver 100C may control the display panel 100. The main controller 1000C may further include a graphics controller. The panel driver 100C may receive an image signal RGB and a first control signal D-CS from the main controller 1000C. The first control signal D-CS may include various signals. For example, the first control signal D-CS may include a vertical synchronization signal, a horizontal synchronization signal, a main clock, a data enable signal, and the like. The panel driver 100C may generate various control signals (e.g., a start signal and a clock signal) for controlling timing for providing a signal to the display panel 100 based on the first control signal D-CS.

The sensor controller 200C may control the input sensor 200. The sensor controller 200C may receive a second control signal I-CS from the main controller 1000C. The second control signal I-CS may include a mode determination signal for determining a driving mode of the sensor controller 200C and a clock signal. The sensor controller 200C may operate in a first mode for detecting the first input by the input device 2000 based on the second control signal I-CS or a second mode for detecting the second input by the body 3000 of the user. The sensor controller 200C may control the input sensor 200 in the first mode or the second mode, which will be described below, based on the mode determination signal.

The sensor controller 200C may calculate coordinate information of the first input or the second input based on the signal received from the input sensor 200 and may provide the main controller 1000C with a coordinate signal I-SS including the coordinate information. The main controller 1000C may execute an operation corresponding to the user input based on the coordinate signal I-SS. For example, the main controller 1000C may operate the panel driver 100C such that a new application image is displayed on the display panel 100 based on the coordinate signal I-SS.

The input device 2000 may include a housing 2100, a power source 2200, a pen controller 2300, a communication module 2400, and a pen electrode 2500. However, the components making up the input device 2000 are not limited to the listed components. For example, the input device 2000 may further include an electrode switch for converting into a signal transmission mode or a signal reception mode, a pressure sensor for sensing pressure, a memory for storing certain information, a rotation sensor for sensing rotation, a haptic feedback component (configured to, for example, provide vibration feedback to the user), or any other suitable functionality or component according to the design of the input device 2000 and the electronic device 1000 (and/or the electronic device 1000F).

The housing 2100 may have a pen shape, and a receiving space may be formed in the housing 2100. The power source 2200, the pen controller 2300, the communication module 2400, and the pen electrode 2500 may be received in the receiving space defined in the housing 2100.

The power source 2200 may supply power to the pen controller 2300, the communication module 2400, or the like in the input device 2000. The power source 2200 may include a battery or a high capacity capacitor.

The pen controller 2300 may control an operation of the input device 2000. The pen controller 2300 may be an application-specific integrated circuit (ASIC). The pen controller 2300 may be configured to operate according to the designed program.

The communication module 2400 may include a transmit circuit 2410 and a receive circuit 2420. The transmit circuit 2410 may output a downlink signal DLS to the input sensor 200. The receive circuit 2420 may receive the uplink signal ULS provided from the input sensor 200. The transmit circuit 2410 may receive the signal provided from the pen controller 2300 to convert the received signal into a signal capable of being sensed by the input sensor 200, and the receive circuit 2420 may modulate the signal provided from the input sensor 200 into a signal capable of being processed by the pen controller 2300.

The pen electrode 2500 may be electrically connected with the communication module 2400. A part of the pen electrode 2500 may protrude from the housing 2100. Alternatively, the input device 2000 may further include a cover housing which covers the pen electrode 2500 exposed from the housing 2100. Alternatively, the pen electrode 2500 may be embedded in the housing 2100.

Figure 4A:
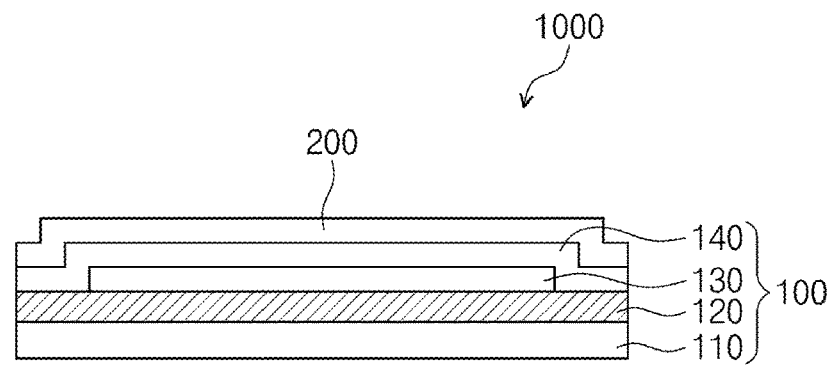
FIGS. 4A and 4B are cross-sectional views of an electronic device according to some embodiments of the present disclosure.

FIG. 4a is a cross-sectional view of an electronic device according to some embodiments of the present disclosure.

Referring to FIG. 4a, an electronic device 1000 may include a display panel 100 and an input sensor 200. The display panel 100 may include a base layer 110, a circuit layer 120, a light emitting element layer 130, and an encapsulation layer 140.

The base layer 110 may be a member which provides a base surface on which the circuit layer 120 is located. The base layer 110 may be a glass substrate, a metal substrate, or a polymer substrate. However, an embodiments is not limited thereto, and the base layer 110 may be an inorganic layer, an organic layer, or a composite material layer.

The base layer 110 may have a multi-layered structure. For example, the base layer 110 may include a first synthetic resin layer, a silicon oxide (SiOx) layer located on the first synthetic resin layer, an amorphous silicon (a-Si) layer located on the silicon oxide layer, and a second synthetic resin layer located on the amorphous silicon layer. The silicon oxide layer and the amorphous silicon layer may be referred to as a "base barrier layer".

Each of the first and second synthetic resin layers may include a polyimide-based resin. Furthermore, each of the first and second synthetic resin layers may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. Meanwhile, the expression "~~-based resin" in the specification refers to including the functional group of "~~".

The circuit layer 120 may be located on the base layer 110. The circuit layer 120 may include an insulating layer, a semiconductor pattern, a conductive pattern, a signal line, and the like. An insulating layer, a semiconductor layer, and a conductive layer may be formed on the base layer 110 in a scheme such as coating or deposition and may then be selectively patterned through a plurality of photolithography processes. Thereafter, the semiconductor pattern, the conductive pattern, and the signal line included in the circuit layer 120 may be formed.

The light emitting element layer 130 may be located on the circuit layer 120. The light emitting element layer 130 may include a light emitting element. For example, the light emitting element layer 130 may be an organic light emitting material, a quantum dot, a quantum rod, a micro-LED, or a nano-LED.

The encapsulation layer 140 may be located on the light emitting element layer 130. The encapsulation layer 140 may protect the light emitting element layer 130 from moisture, oxygen, and foreign substances such as dust particles.

The input sensor 200 may be formed on the display panel 100 through consecutive processes. In this case, it may be represented that the input sensor 200 is directly located on the display panel 100. The expression "directly located" or "directly arranged" may mean that a third component is not located between the input sensor 200 and the display panel 100. In other words, a separate adhesive member may not be located between the input sensor 200 and the display panel 100. Alternatively, the input sensor 200 may be coupled to the display panel 100 by means of an adhesive member. The adhesive member may include a typical adhesive or sticking agent.

Figure 4B:
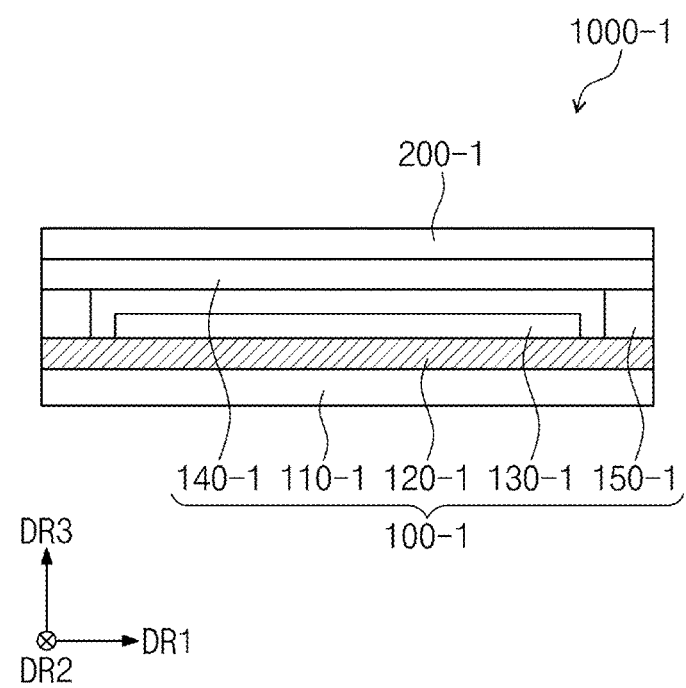

FIG. 4b is a cross-sectional view of an electronic device according to some embodiments of the present disclosure.

Referring to FIG. 4B, an electronic device 1000-1 may include a display panel 100-1 and an input sensor 200-1. The display panel 100-1 may include a base substrate 110-1, a circuit layer 120-1, a light emitting element layer 130-1, an encapsulation substrate 140-1, and a coupling member 150-1.

Each of the base substrate 110-1 and the encapsulation substrate 140-1 may be, but are not particularly limited to, a glass substrate, a metal substrate, a polymer substrate, or the like.

The coupling member 150-1 may be located between the base substrate 110-1 and the encapsulation substrate 140-1. The coupling member 150-1 may couple the encapsulation substrate 140-1 to the base substrate 110-1 or the circuit layer 120-1. The coupling member 150-1 may include an inorganic material or an organic material. For example, the inorganic material may include a frit seal, and the organic material may include a photo-curable material or a photo-plastic resin. However, a material making up the coupling member 150-1 is not limited to the above example.

The input sensor 200-1 may be directly located on the encapsulation substrate 140-1. The expression "directly located" or "directly arranged" may mean that a third component is not located between the input sensor 200-1 and the encapsulation substrate 140-1. In other words, a separate adhesive member may not be located between the input sensor 200-1 and the display panel 100-1. However, embodiments according to the present disclosure are not limited thereto, and according to some embodiments, an adhesive layer may be further located between the input sensor 200-1 and the encapsulation substrate 140-1.

Figure 5:
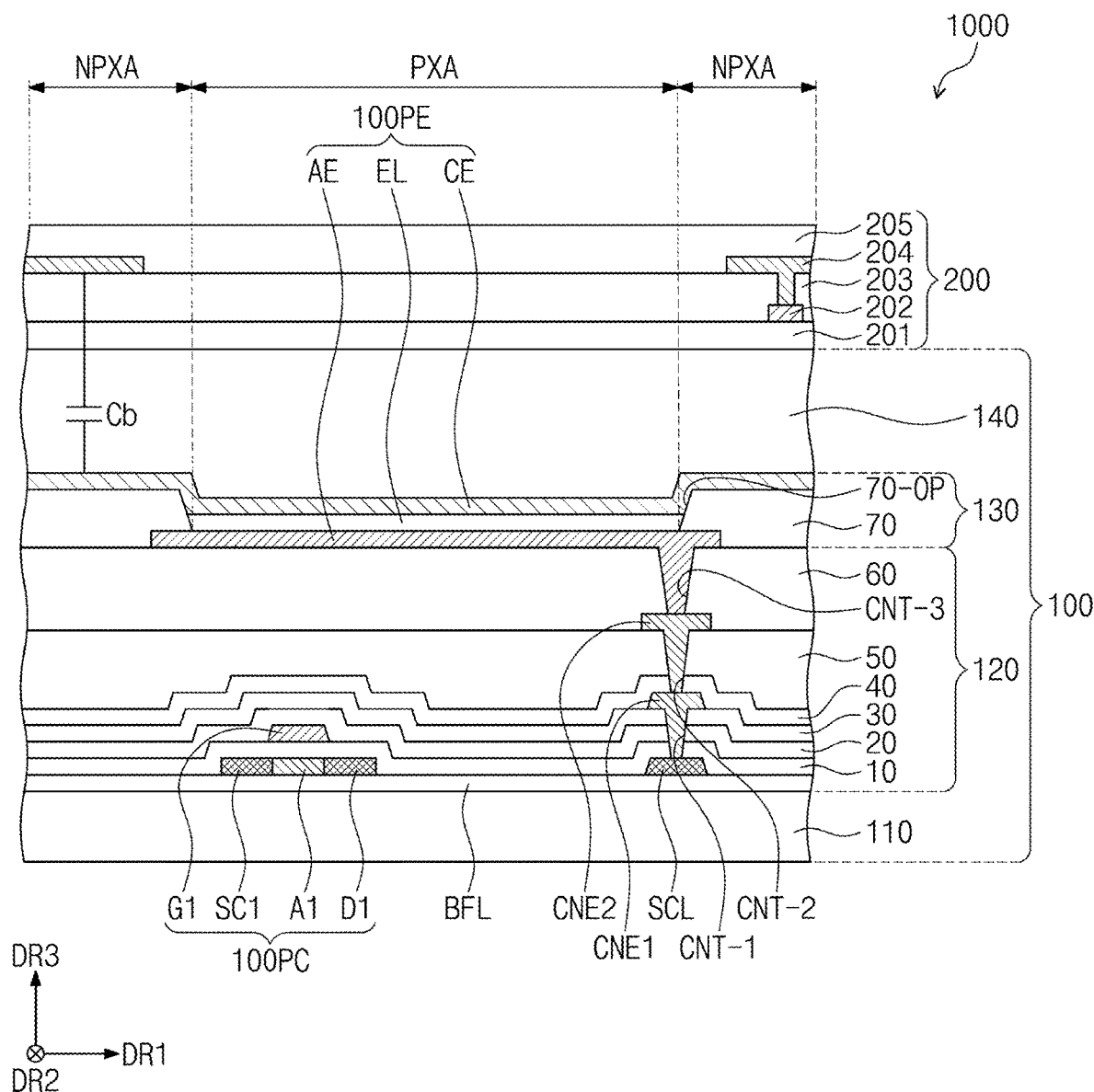
FIG. 5 is a cross-sectional view of an electronic device according to some embodiments of the present disclosure.

FIG. 5 is a cross-sectional view of an electronic device according to some embodiments of the present disclosure. In describing FIG. 5, the same reference numerals are assigned to the same components described with reference to FIG. 4A, and thus some repetitive description thereof may be omitted.

Referring to FIG. 5, at least one inorganic layer may be formed on an upper surface of a base layer 110. The inorganic layer may include at least one of aluminum oxide, titanium oxide, silicon oxide, silicon oxynitride, silicon nitride, zirconium oxide, or hafnium oxide. The inorganic layer may be formed of multiple layers. The multiple inorganic layers may make up a barrier layer and/or a buffer layer. According to some embodiments, a display panel 100 is illustrated as including a buffer layer BFL.

The buffer layer BFL may relatively improve a bonding force between the base layer 110 and a semiconductor pattern. The buffer layer BFL may include a silicon oxide layer and a silicon nitride layer, and the silicon oxide layer and the silicon nitride layer may be alternately laminated.

The semiconductor pattern may be located on the buffer layer BFL. The semiconductor pattern may include polysilicon. However, embodiments according to the present disclosure are not limited thereto, and the semiconductor pattern may include amorphous silicon, low-temperature polycrystalline silicon, or oxide semiconductor.

FIG. 5 illustrates only a portion of the semiconductor pattern, and the semiconductor pattern may be further located in other regions. Semiconductor patterns may be arranged across pixels in a specific arrangement. An electrical property of the semiconductor pattern may vary depending on whether it is doped, and the manner in which it is doped. The semiconductor pattern may include a first area having high conductivity and a second area having low conductivity. The first area may be doped with an N-type dopant or a P-type dopant. A P-type transistor may include a doping area doped with the P-type dopant, and an N-type transistor may include a doping area doped with the N-type dopant. The second area may be an undoped region or may be doped at a low concentration compared to the first area.

The first area may be greater in conductivity than the second area and may substantially serve as an electrode or a signal line. The second area may substantially correspond to a channel area of a transistor. In other words, a part of the semiconductor pattern may be a channel part of a transistor, another part thereof may be a source or a drain of the transistor, and another part thereof may be a connection electrode or a connection signal line.

Each of pixels may have an equivalent circuit including seven transistors, one capacitor, and a light emitting element, and the equivalent circuit of the pixel may be modified in various forms. One transistor 100PC and one light emitting element 100PE included in the pixel are illustrated as an example in FIG. 5.

The transistor 100PC may include a source SC1, a channel part A1, a drain D1, and a gate G1. The source SC1, the channel part A1, and the drain D1 may be formed from the semiconductor pattern. The source SC1 and the drain D1 may extend in opposite directions from the channel part A1 on the cross-section. FIG. 5 illustrates a part of a connection signal line SCL formed from the semiconductor pattern. According to some embodiments, the connection signal line SCL may be electrically connected with the drain D1 of the transistor 100PC on the plane.

A first insulating layer 10 may be located on a buffer layer BFL. The first insulating layer 10 may be overlapped with a plurality of pixels in common and may cover the semiconductor pattern. The first insulating layer 10 may be an inorganic layer and/or an organic layer and may have a single- or multi-layered structure. The first insulating layer 10 may include at least one of aluminum oxide, titanium oxide, silicon oxide, silicon nitride, silicon oxynitride, zirconium oxide, or hafnium oxide. According to some embodiments, the first insulating layer 10 may be a single silicon oxide layer. As well as the first insulating layer 10, an insulating layer of a circuit layer 120 to be described below may be an inorganic layer and/or an organic layer and may have a single- or multi-layered structure. The inorganic layer may include, but is not limited to, at least one of the materials described above.

The gate G1 may be located on the first insulating layer 10. The gate G1 may be a part of a metal pattern. The gate G1 may be overlapped with the channel part A1. The gate G1 may function as a mask in the process of doping the semiconductor pattern.

A second insulating layer 20 may be located on the first insulating layer 10 and may cover the gate G1. The second insulating layer 20 may be overlapped with pixels in common. The second insulating layer 20 may be an inorganic layer and/or an organic layer and may have a single- or multi-layered structure. The second insulating layer 20 may include at least one of silicon oxide, silicon nitride, or silicon oxynitride. According to some embodiments, the second insulating layer 20 may have a multi-layered structure including a silicon oxide layer and a silicon nitride layer.

A third insulating layer 30 may be located on the second insulating layer 20. The third insulating layer 30 may have a single- or multi-layered structure. For example, the third insulating layer 30 may have a multi-layered structure including a silicon oxide layer and a silicon nitride layer.

A first connection electrode CNE1 may be located on the third insulating layer 30. The first connection electrode CNE1 may be connected with the connection signal line SCL through a contact hole CNT-1 penetrating the first, second, and third insulating layers 10, 20, and 30.

A fourth insulating layer 40 may be located on the third insulating layer 30. The fourth insulating layer 40 may be a single silicon oxide layer. A fifth insulating layer 50 may be located on the fourth insulating layer 40. The fifth insulating layer 50 may be an organic layer.

A second connection electrode CNE2 may be located on the fifth insulating layer 50. The second connection electrode CNE2 may be connected with the first connection electrode CNE1 through a contact hole CNT-2 penetrating the fourth insulating layer 40 and the fifth insulating layer 50.

A sixth insulating layer 60 may be located on the fifth insulating layer 50 and may cover the second connection electrode CNE2. The sixth insulating layer 60 may be an organic layer.

A light emitting element layer 130 may be located on the circuit layer 120. The light emitting element layer 130 may include a light emitting element 100PE. For example, the light emitting element layer 130 may include an organic light emitting material, an inorganic light emitting material, a quantum dot, a quantum rod, a micro-LED, or a nano-LED. Hereinafter, an example in which the light emitting element 100PE is an organic light emitting element will be described, but embodiments according to the present disclosure are not specifically limited thereto.

The light emitting element 100PE includes a first electrode AE, a light emitting layer EL, and a second electrode CE. The first electrode AE may be located on the sixth insulating layer 60. The first electrode AE may be connected with the second connection electrode CNE2 through a contact hole CNT-3 penetrating the sixth insulating layer 60.

A pixel definition layer 70 may be located on the sixth insulating layer 60 and may cover a part of the first electrode AE. An opening 70-OP may be defined in the pixel definition layer 70. The opening 70-OP of the pixel definition layer 70 may expose at least a part of the first electrode AE.

An active area 1000A (refer to FIG. 1) may include a light emitting area PXA and a non-light emitting area NPXA adjacent to the light emitting area PXA. The non-light emitting area NPXA may surround the light emitting area PXA. According to some embodiments, the light emitting area PXA is defined to correspond to a partial area of the first electrode AE, which is exposed by the opening 70-OP.

The light emitting layer EL may be located on the first electrode AE. The light emitting layer EL may be located in an area corresponding to the opening 70-OP. In other words, the light emitting layer EL may be separately arranged in each of the pixels. When the light emitting layers EL are separately arranged in the pixels, each of the light emitting layers EL may emit light of at least one of a blue color, a red color, or a green color. However, embodiments according to the present disclosure are not limited thereto. The light emitting layer EL may be connected with the pixels to be provided in common. In this case, the light emitting layer EL may provide blue light or may provide white light.

The second electrode CE may be located on the light emitting layer EL. The second electrode CE may be in the shape of integration and may be arranged in common in a plurality of pixels.

According to some embodiments, a hole control layer may be located between the first electrode AE and the light emitting layer EL. The hole control layer may be arranged in common in the light emitting area PXA and the non-light emitting area NPXA. The hole control layer may include a hole transport layer and may further include a hole injection layer. An electron control layer may be located between the light emitting layer EL and the second electrode CE. The electron control layer may include an electron transport layer and may further include an electron injection layer. The hole control layer and the electron control layer may be formed in common in the plurality of pixels using an open mask.

The encapsulation layer 140 may be located on the light emitting element layer 130. An encapsulation layer 140 may include an inorganic layer, an organic layer, and an inorganic layer sequentially laminated, and layers making up the encapsulation layer 140 are not limited thereto.

The inorganic layers may protect the light emitting element layer 130 from moisture and oxygen, and the organic layer may protect the light emitting element layer 130 from foreign substances such as dust particles. The inorganic layers may include a silicon nitride layer, a silicon oxynitride layer, a silicon oxide layer, a titanium oxide layer, an aluminum oxide layer, or the like. The organic layer may include, but is not limited to, an acrylic-based organic layer.

The input sensor 200 may be formed on the display panel 100 through consecutive processes. In this case, it may be represented that the input sensor 200 is directly located on the display panel 100. The expression "directly located" or "directly arranged" may mean that a third component is not located between the input sensor 200 and the display panel 100. In other words, a separate adhesive member may not be located between the input sensor 200 and the display panel 100. Alternatively, the input sensor 200 may be coupled to the display panel 100 by means of an adhesive member. The adhesive member may include a typical adhesive or sticking agent.

The input sensor 200 may include a base insulating layer 201, a first conductive layer 202, a sensing insulating layer 203, a second conductive layer 204, and a cover insulating layer 205.

The base insulating layer 201 may be an inorganic layer including at least any one of silicon nitride, silicon oxynitride, and silicon oxide. Alternatively, the base insulating layer 201 may be an organic layer including an epoxy resin, an acrylic resin, or an imide-based resin. The base insulating layer 201 may have a single-layered structure or may be a multi-layered structure in which a plurality of layers are laminated along the third direction DR3.

Each of the first conductive layer 202 and the second conductive layer 204 may have a single-layered structure or may have a multi-layered structure in which a plurality of layers are laminated along the third direction DR3.

A conductive layer of a single-layered structure may include a metal layer or a transparent conductive layer. The metal layer may include molybdenum, silver, titanium, copper, aluminum, or an alloy thereof. The transparent conductive layer may include transparent conductive oxide such as indium tin oxide (ITO), indium zinc oxide (IZO), zinc oxide (ZnO), or indium zinc tin oxide (IZTO). In addition, the transparent conductive layer may include conductive polymer such as PEDOT, metal nanowire, graphene, or the like.

The conductive layer of the multi-layered structure may include metal layers. The metal layers may have, for example, a three-layered structure of titanium/aluminum/ titanium. The conductive layer of the multi-layered structure may include at least one metal layer and at least one transparent conductive layer.

At least any one of the sensing insulating layer 203 and the cover insulating layer 205 may include an inorganic layer. The inorganic layer may include at least one of aluminum oxide, titanium oxide, silicon oxide, silicon nitride, silicon oxynitride, zirconium oxide, or hafnium oxide.

At least any one of the sensing insulating layer 203 and the cover insulating layer 205 may include an organic layer. The organic layer may include at least any one of an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin.

Parasitic capacitance Cb may be generated between the input sensor 200 and the second electrode CE. The closer the distance between the input sensor 200 and the second electrode CE, the more the value of the parasitic capacitance Cb may increase. The larger the parasitic capacitance Cb, the more the ratio of the variation in capacitance to a reference value may decrease. The variation in the capacitance may mean a change in capacitance, which occurs before and after an input by an input means, for example, an input device 2000 (refer to FIG. 3) or a body 3000 (refer to FIG. 3) of a user.

A sensor controller 200C (refer to FIG. 3) which processes the signal sensed from the input sensor 200 may perform a leveling operation for removing a value corresponding to the parasitic capacitance Cb from the sensed signal. As the ratio of the variation in capacitance to the reference value may increase by the leveling operation, sensing sensitivity may be relatively improved.

Figure 6:
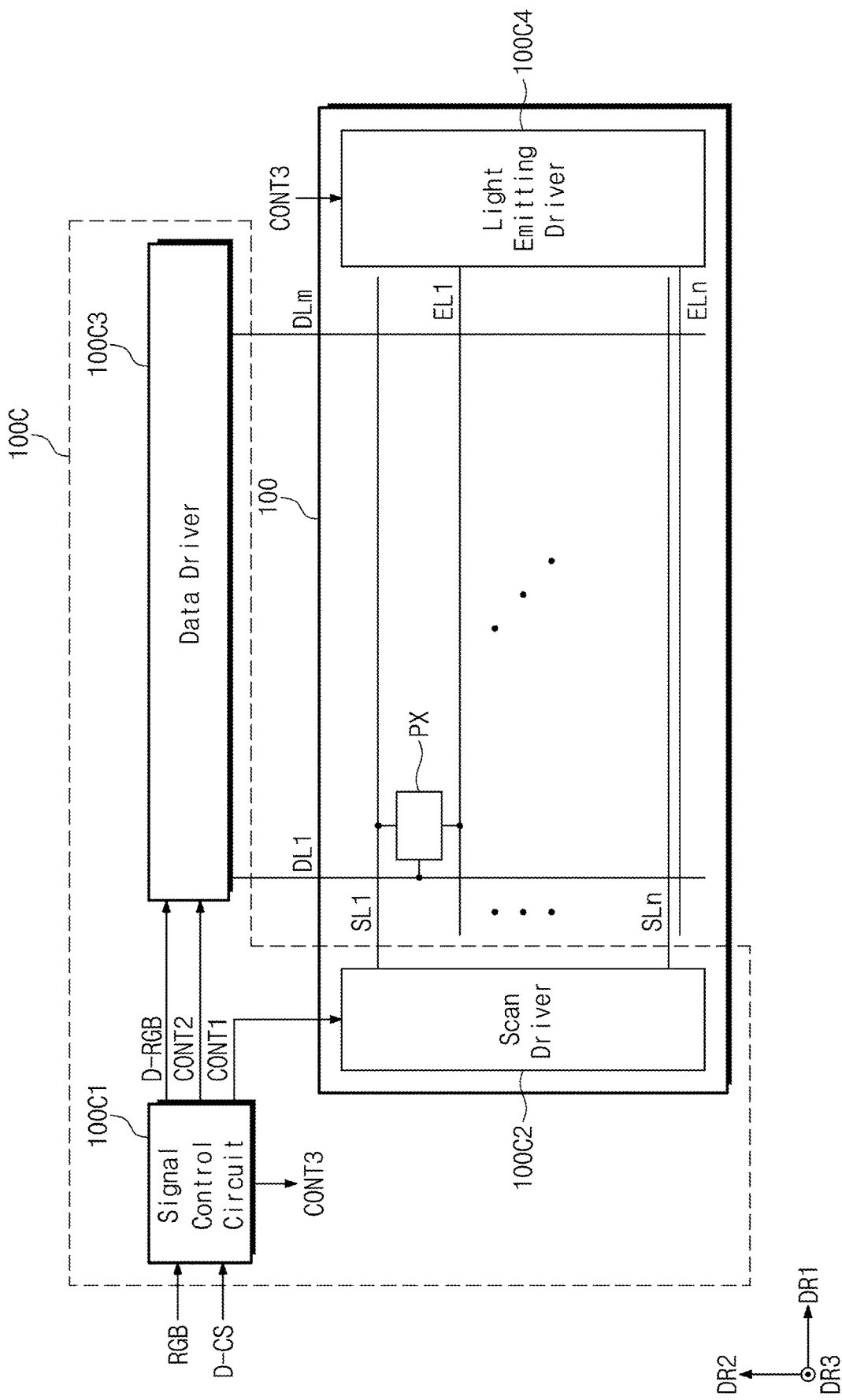
FIG. 6 is a block diagram of a display panel and a panel driver according to some embodiments of the present disclosure.

FIG. 6 is a block diagram of a display panel and a panel driver according to some embodiments of the present disclosure.

Referring to FIG. 6, a display panel 100 may include a plurality of scan lines SL1 to SLn, a plurality of data lines DL1 to DLm, a plurality of light emitting control lines EL1 to ELn, and a plurality of pixels PX. Each of the plurality of pixels PX may be connected with a corresponding data line among the plurality of data lines DL1 to DLm and may be connected with a corresponding scan line among the plurality of scan lines SL1 to SLn and a corresponding light emitting control line among the plurality of light emitting control lines EU to ELn.

A panel driver 100C may include a signal control circuit 100C1, a scan driver 100C2, a data driver 100C3, and a light emitting driver 100C4.

The signal control circuit 100C1 may receive an image signal RGB and a first control signal D-CS from a main controller 1000C (refer to FIG. 3). The first control signal D-CS may include various signals. For example, the first control signal D-CS may include a vertical synchronization signal, a horizontal synchronization signal, a main clock, a data enable signal, and the like.

The signal control circuit 100C1 may generate a scan control signal CONT1, a data control signal CONT2, and a light emitting control signal CONT3 based on the first control signal D-CS. The signal control circuit 100C1 may provide the scan control signal CONT1 to the scan driver 100C2, may provide the data control signal CONT2 to the data driver 100C3, and may provide the light emitting control signal CONT3 to the light emitting driver 100C4. Furthermore, the signal control circuit 100C1 may output image data D-RGB, which is obtained by processing the image signal RGB to suit an operating condition of the display panel 100, to the data driver 100C3.

The scan driver 100C2 may drive the plurality of scan lines SL1 to SLn in response to the scan control signal CONT1. The scan control signal CONT1 may include a scan start signal FLM (refer to FIG. 14A), a scan clock signal CLK (refer to FIG. 14A), or the like. According to some embodiments of the present disclosure, the scan driver 100C2 may be formed in the same process as the circuit layer 120 (refer to FIG. 5) in the display layer 100, but embodiments according to the present disclosure are not limited thereto. For example, the scan driver 100C2 may be implemented as an integrated circuit (IC) to be directly mounted on a certain region of the display layer 100 or be mounted on a separate printed circuit board in a chip on film (COF) manner to be electrically connected with the display panel 100.

The data driver 100C3 may output data signals for driving the plurality of data lines DL1 to DLm in response to the data control signal CONT2 and the image data D-RGB from the signal control circuit 100C1. The data driver 100C3 may be implemented as an IC to be directly mounted on a certain region of the display layer 100 or be mounted on a separate printed circuit board in a COF manner to be electrically connected with the display panel 100, but not particularly limited thereto. For example, the data driver 100C3 may be formed in the same process as the circuit layer 120 in the display panel 100.

The light emitting driver 100C4 may drive the plurality of light emitting control lines EL1 to ELn in response to the light emitting control signal CONT3. The light emitting control signal CONT3 may include a light emitting start signal E_FLM (refer to FIG. 14A), a light emitting clock signal E_CLK (refer to FIG. 14A), or the like. According to some embodiments of the present disclosure, the light emitting driver 100C4 may be formed in the same process as the circuit layer 120 in the display layer 100, but not limited thereto. For example, the light emitting driver 100C4 may be implemented as an integrated circuit (IC) to be directly mounted on a certain region of the display layer 100 or be mounted on a separate printed circuit board in a chip on film (COF) manner to be electrically connected with the display panel 100.

According to some embodiments of the present disclosure, the light emitting driver 100C4 may have a component independent of the scan driver 100C2, but embodiments according to the present disclosure are not limited thereto. For example, the scan driver 100C2 and the light emitting driver 100C4 may be implemented into one integrated circuit.

Figure 7:
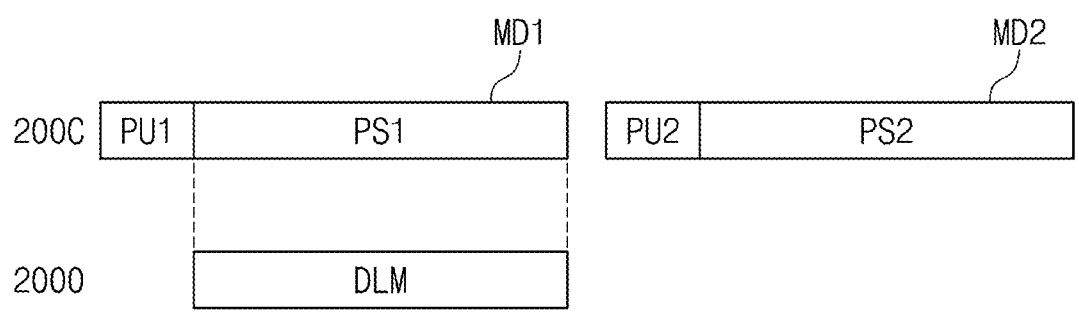
FIG. 7 is a conceptual diagram illustrating operations of a first mode and a second mode according to some embodiments of the present disclosure.

FIG. 7 is a conceptual diagram illustrating operations of a first mode and a second mode according to some embodiments of the present disclosure.

Referring to FIGS. 3 and 7, a sensor controller 200C may operate in a first mode MD1 for detecting a first input by an input device 2000 or a second mode MD2 for detecting a second input by a body 3000 of a user.

The first mode MD1 may include a first interval PU1 and a second interval PS1. The second interval PS1 may proceed after the first interval PU1. The first interval PU1 may be an uplink interval where an uplink signal ULS is able to be transmitted to an input sensor 200. The second interval PS1 may be a downlink interval where a downlink signal DLS provided from the input device 2000 is able to be received through the input sensor 200. The input sensor 200 may sense the first input of the input device 2000 based on the downlink signal DLS.

The input device 2000 may provide the downlink signal DLS to the sensor controller 200C during the downlink interval DLM.

The sensor controller 200C may operate in the second mode MD2, after the first mode MD1 is ended. The first mode MD1 and the second mode MD2 may be repeated with each other.

The second mode MD2 may include a first interval PU2 and a second interval PS2. The second interval PS2 may proceed after the first interval PU2. The first interval PU2 may be an uplink interval where an uplink signal ULS is able to be transmitted to the input sensor 200. The second interval PS2 may be an interval where the second input is detected by the body 3000 of the user.

The input device 2000 may provide the input sensor 200 with a response signal to the uplink signal ULS. When receiving the response signal sensed by the input sensor 200 in the first interval PU1 or PU2, the sensor controller 200C may operate in the second interval PS1 of the first model MD1. When not receiving the response signal from the input device 2000 in the first interval PU2, the sensor controller 200C may operate in the second interval PS2 of the second model MD2. Thus, the input sensor 200 may periodically monitor whether there is sensing of the input device 2000 and may easily sense the first input by the input device 2000. However, this is merely illustrative, and the operation of the electronic device 1000 is not particularly limited thereto.

Figure 8:
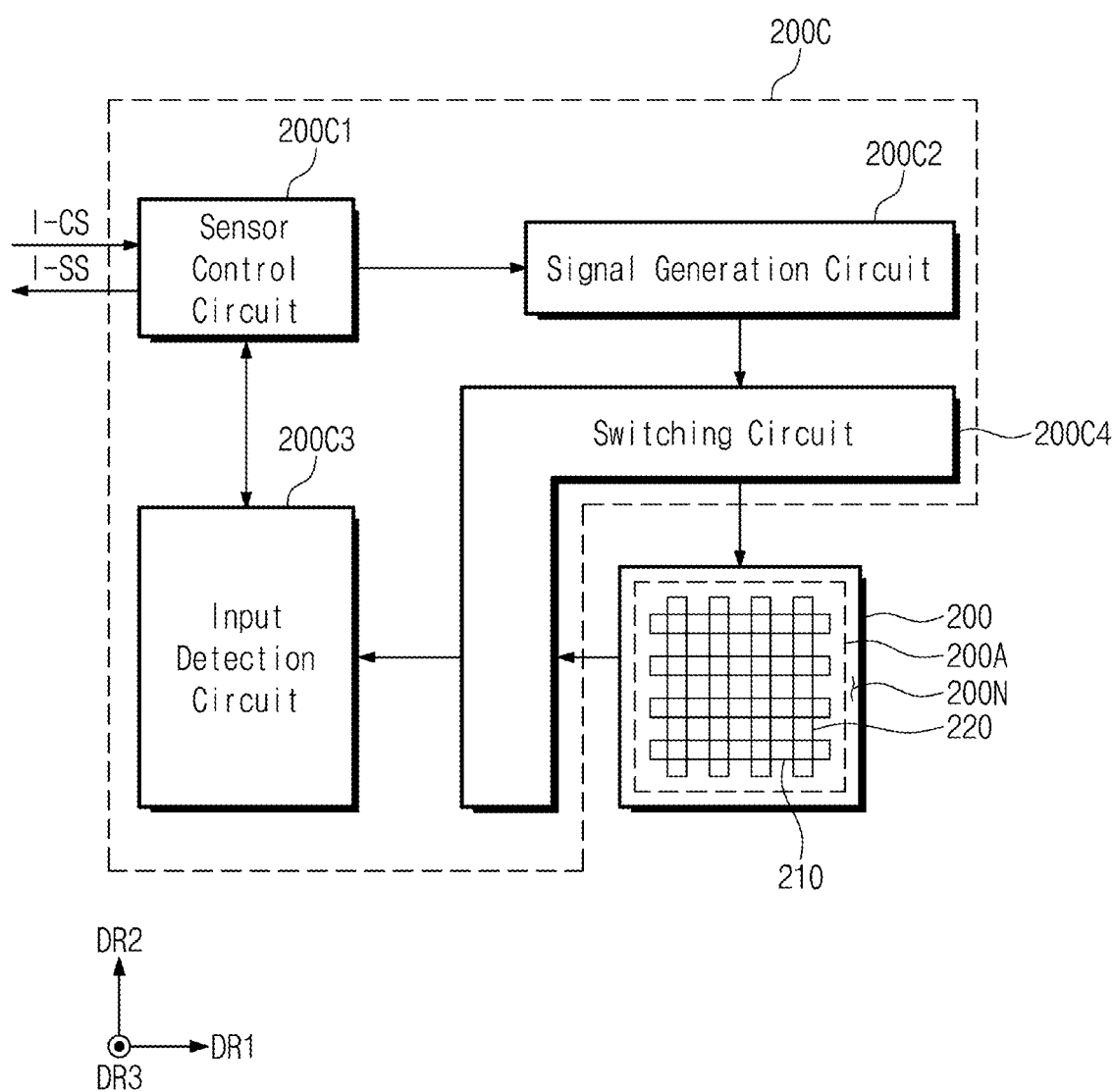
FIG. 8 is a block diagram of an input sensor and a sensor controller according to some embodiments of the present disclosure.

FIG. 8 is a block diagram of an input sensor and a sensor controller according to some embodiments of the present disclosure.

Referring to FIG. 8, a sensing area 200A and a non-sensing area 200N may be defined in an input sensor 200. The sensing area 200A may be an area which is activated according to an electrical signal. For example, the sensing area 200A may be an area where an input is sensed. The sensing area 200A may be overlapped with an active area 1000A (refer to FIG. 1) of an electronic device 1000 (refer to FIG. 1). The non-sensing area 200N may surround the sensing area 200A. The non-sensing area 200N may be overlapped with a non-active area 1000NA (refer to FIG. 1) of the electronic device 1000 (refer to FIG. 1).

The input sensor 200 may include a plurality of transmit electrodes 210 and a plurality of receive electrodes 220. Each of the plurality of transmit electrodes 210 may extend along the first direction DR1, and the plurality of transmit electrodes 210 may be arranged spaced apart from each other in the second direction DR2. Each of the plurality of receive electrodes 220 may extend along the second direction DR2, and the plurality of receive electrodes 220 may be arranged to be spaced apart from each other in the first direction DR1.

The plurality of receive electrodes 220 may intersect the plurality of transmit electrodes 210 to be insulated. Each of the plurality of transmit electrodes 210 and the plurality of receive electrodes 220 may have a bar shape or a stripe shape (e.g., elongated linearly in one direction with relatively short sides in the perpendicular direction). The plurality of transmit electrodes 210 and the plurality of receive electrodes 220, each of which has such a shape, may relatively improve sensing characteristics of consecutive linear inputs. However, the shape of each of the plurality of transmit electrodes 210 and the plurality of receive electrodes 220 is not limited thereto.

A sensor controller 200C may receive a second control signal I-CS from a main controller 1000C (refer to FIG. 3) and may provide a coordinate signal I-SS to a main controller 1000C (refer to FIG. 3).

The sensor controller 200C may include a sensor control circuit 200C1, a signal generation circuit 200C2, an input detection circuit 200C3, and a switching circuit 200C4. The sensor control circuit 200C1, the signal generation circuit 200C2, and the input detection circuit 200C3 may be implemented in a single chip, or some of the sensor control circuit 200C1, the signal generation circuit 200C2, and the input detection circuit 200C3 and the others may be implemented in different chips.

The sensor control circuit 200C1 may control operations of the signal generation circuit 200C2 and the switching circuit 200C4 and may calculate coordinates of an external input from a driving signal received from the input detection circuit 200C3 or may analyze information, transmitted from an input device 2000 (refer to FIG. 3), from a modulation signal received from the input detection circuit 200C3. The sensor control circuit 200C1 may define the sensing area 200A of the input sensor 200 into a plurality of areas. The sensor control circuit 200C1 may provide a first uplink signal to some of the plurality of areas and may provide a second uplink signal having a reverse phase of the first uplink signal to the others. This will be described in more detail below.

The signal generation circuit 200C2 may provide the input sensor 200 with an output signal called a transmit signal. The signal generation circuit 200C2 may output an output signal matched with an operation mode to the input sensor 200.

The input detection circuit 200C3 may convert an analog type of receive signal (or sensing signal) received from the input sensor 200 into a digital signal. The input detection circuit 200C3 may amplify and filter the receive signal. The input detection circuit 200C3 may convert the subsequently filtered signal into a digital signal.

The switching circuit 200C4 may selectively control an electrical connection relationship between the input sensor 200 and the signal generation circuit 200C2 and/or the input detection circuit 200C3 under control of the sensor control circuit 200C1. The switching circuit 200C4 may connect a group of any one of the plurality of transmit electrodes 210 and the plurality of receive electrodes 220 with the signal generation circuit 200C2 or may connect each of the plurality of transmit electrodes 210 and the plurality of receive electrodes 220 with the signal generation circuit 200C2, under control of the sensor control circuit 200C1. Alternatively, the switching circuit 200C4 may connect one group or all of the plurality of transmit electrodes 210 and the plurality of receive electrodes 220 with the input detection circuit 200C3.

Figure 9A:
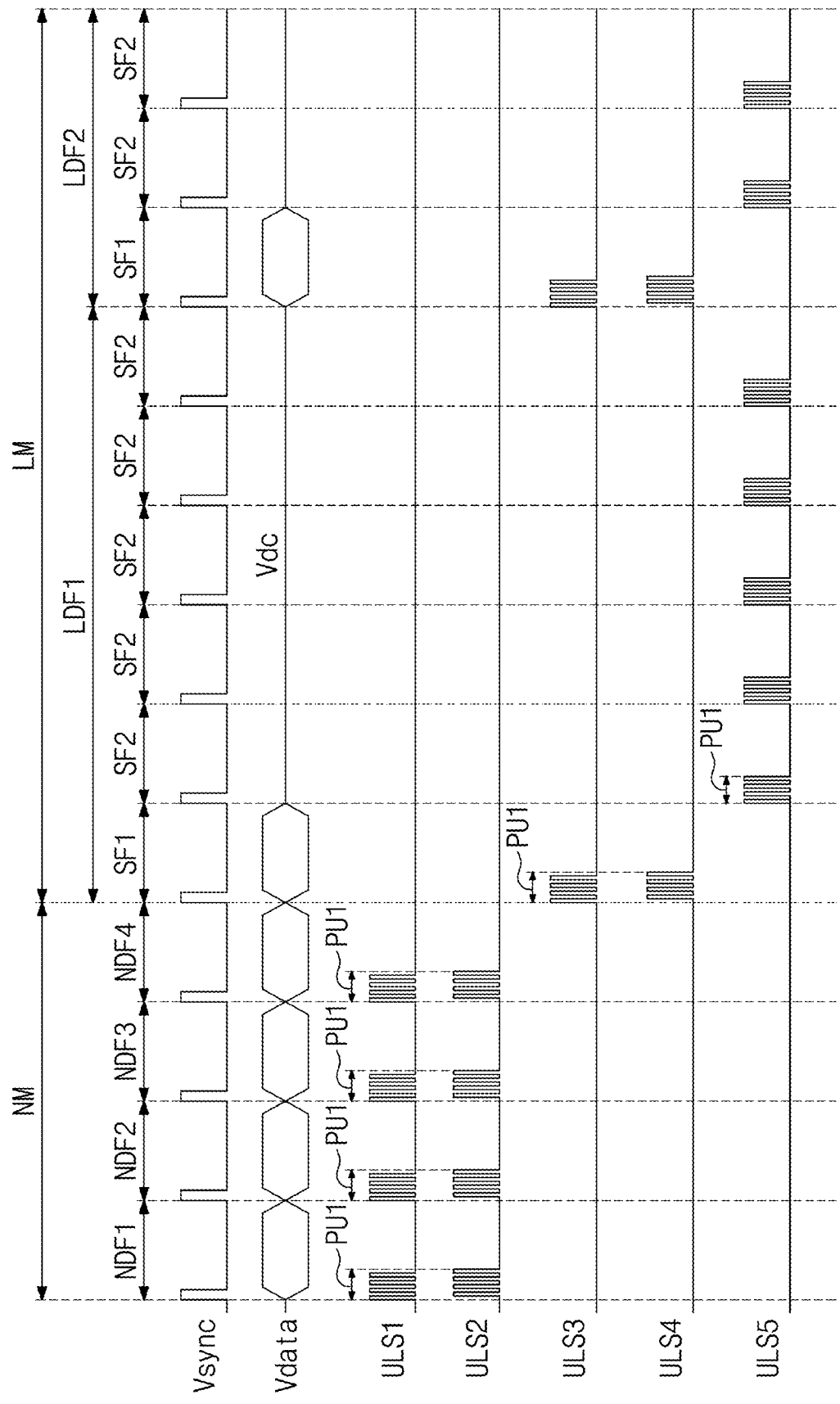
FIGS. 9A and 9B are waveform diagrams illustrating uplink signals according to some embodiments of the present disclosure.
Figure 9B:
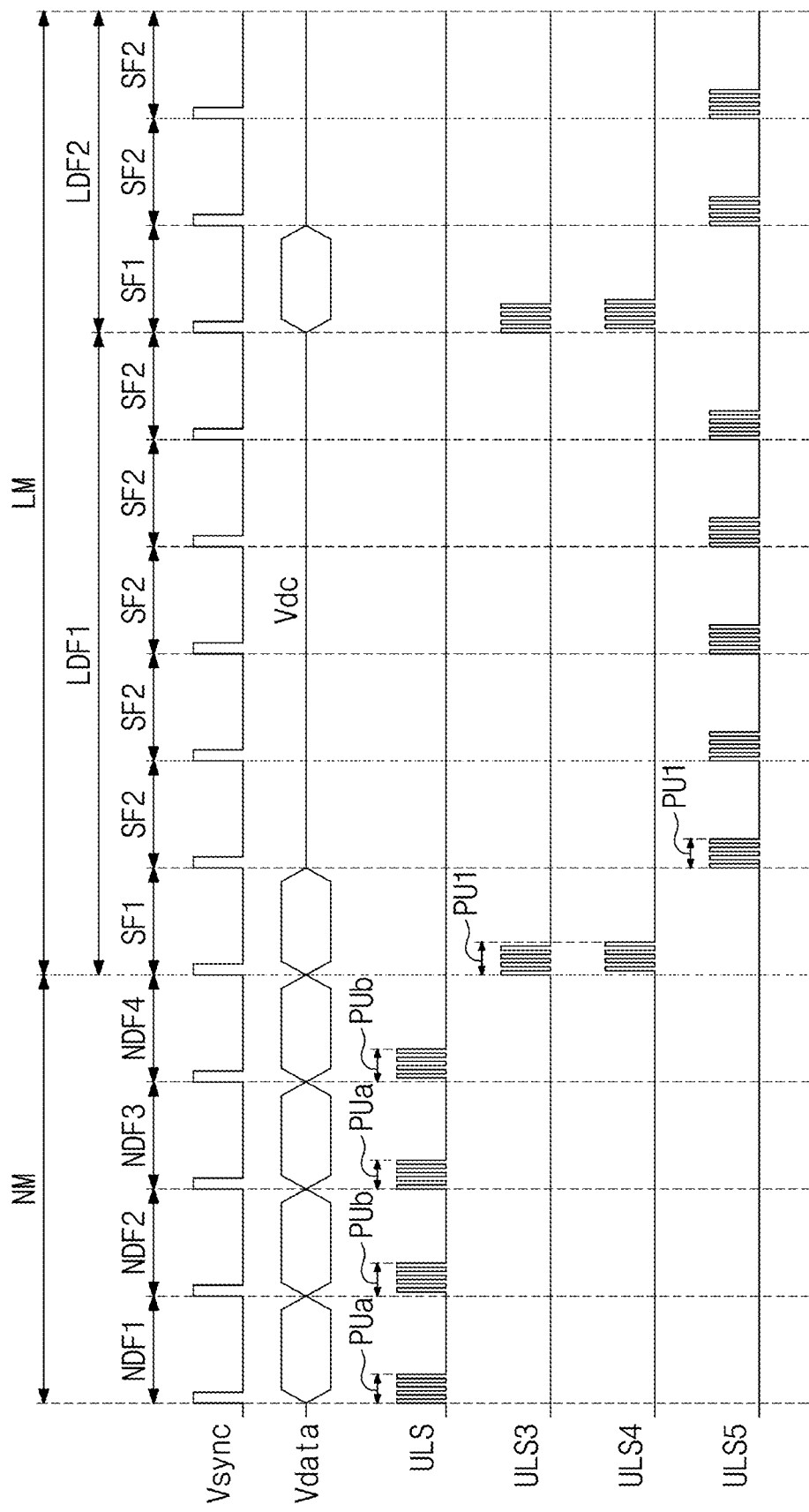
Figure 11A:
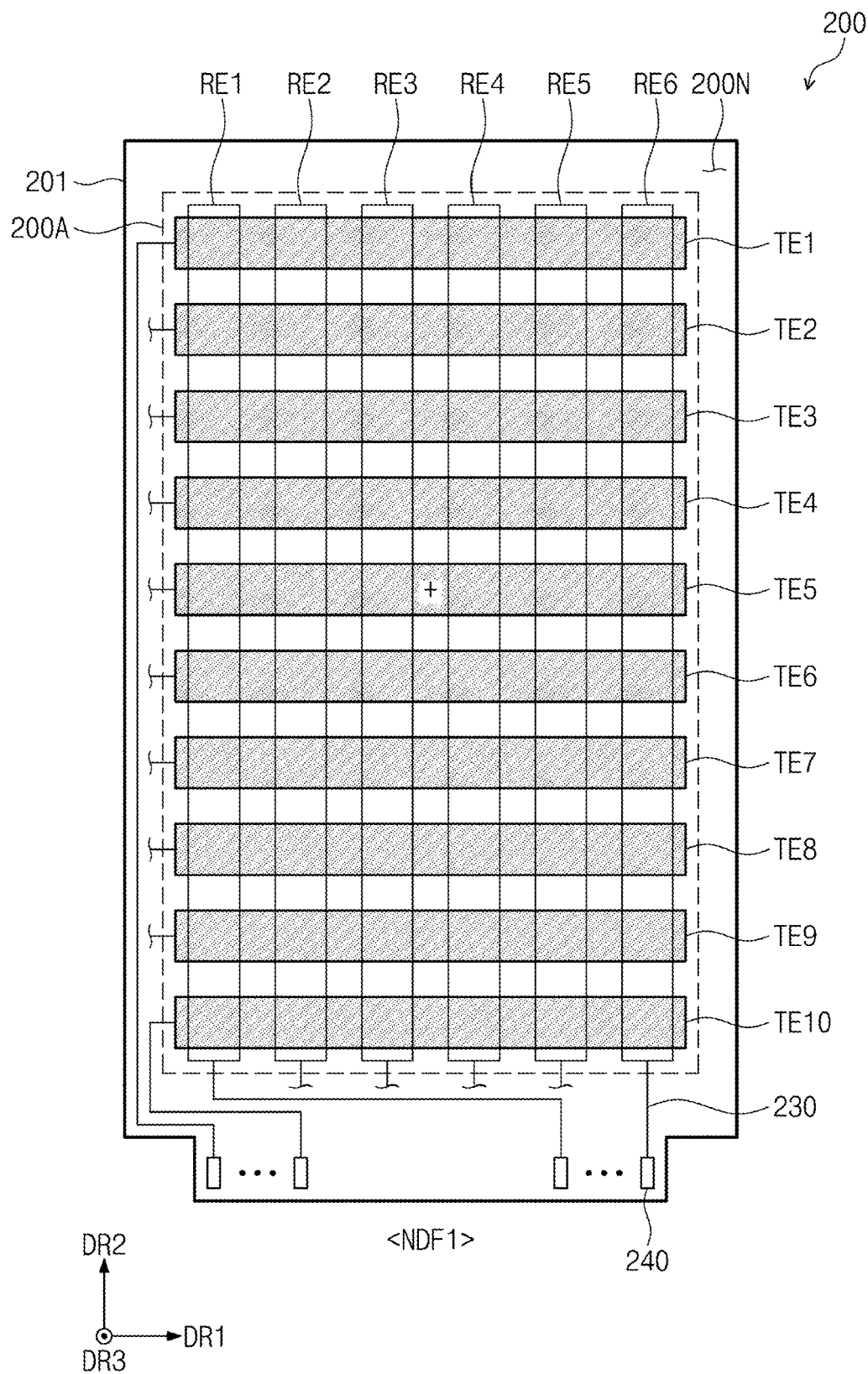
FIGS. 11A and 11B are plan views illustrating an operation of an input sensor in a first driving mode.
Figure 11B:
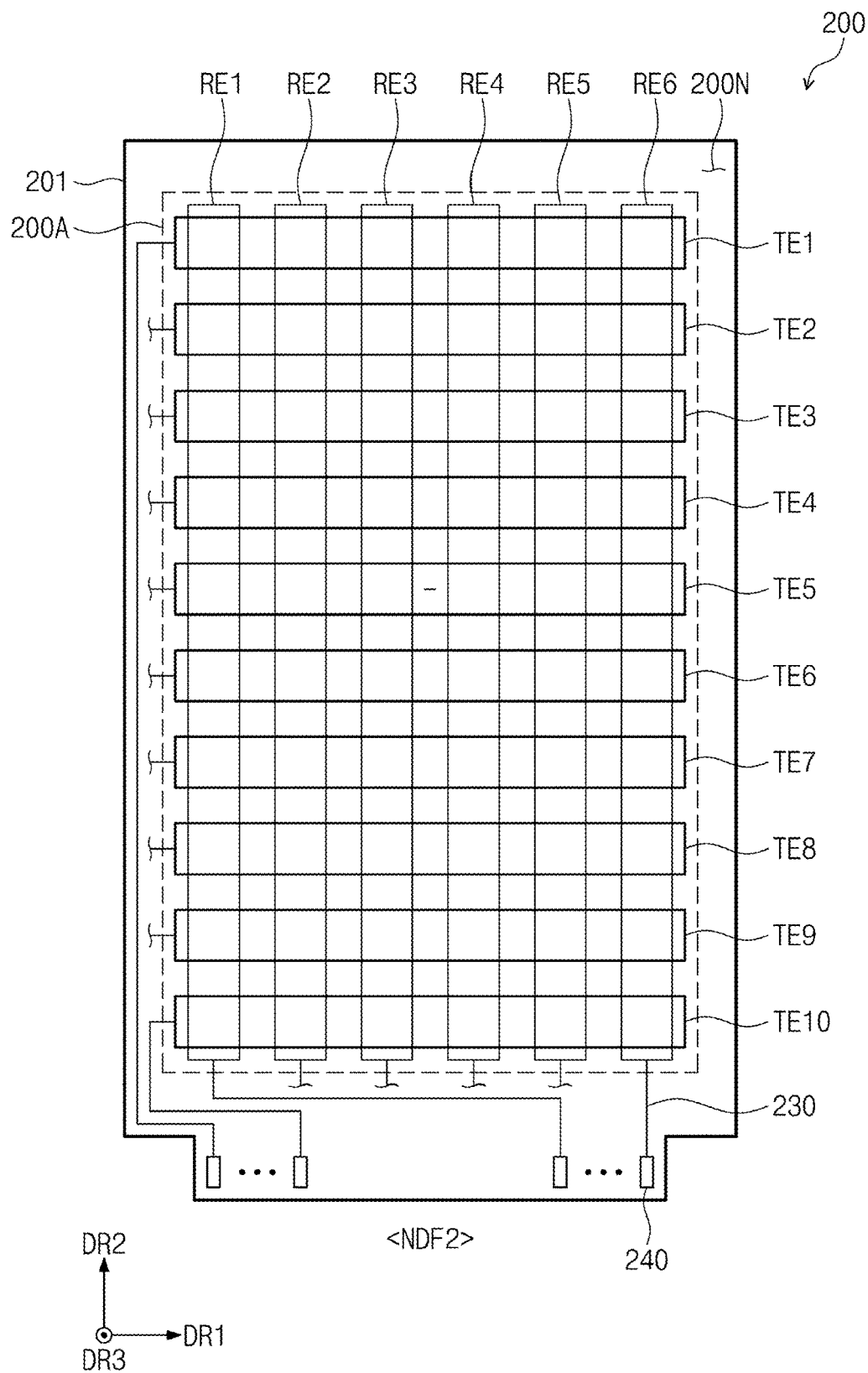
Figure 12:
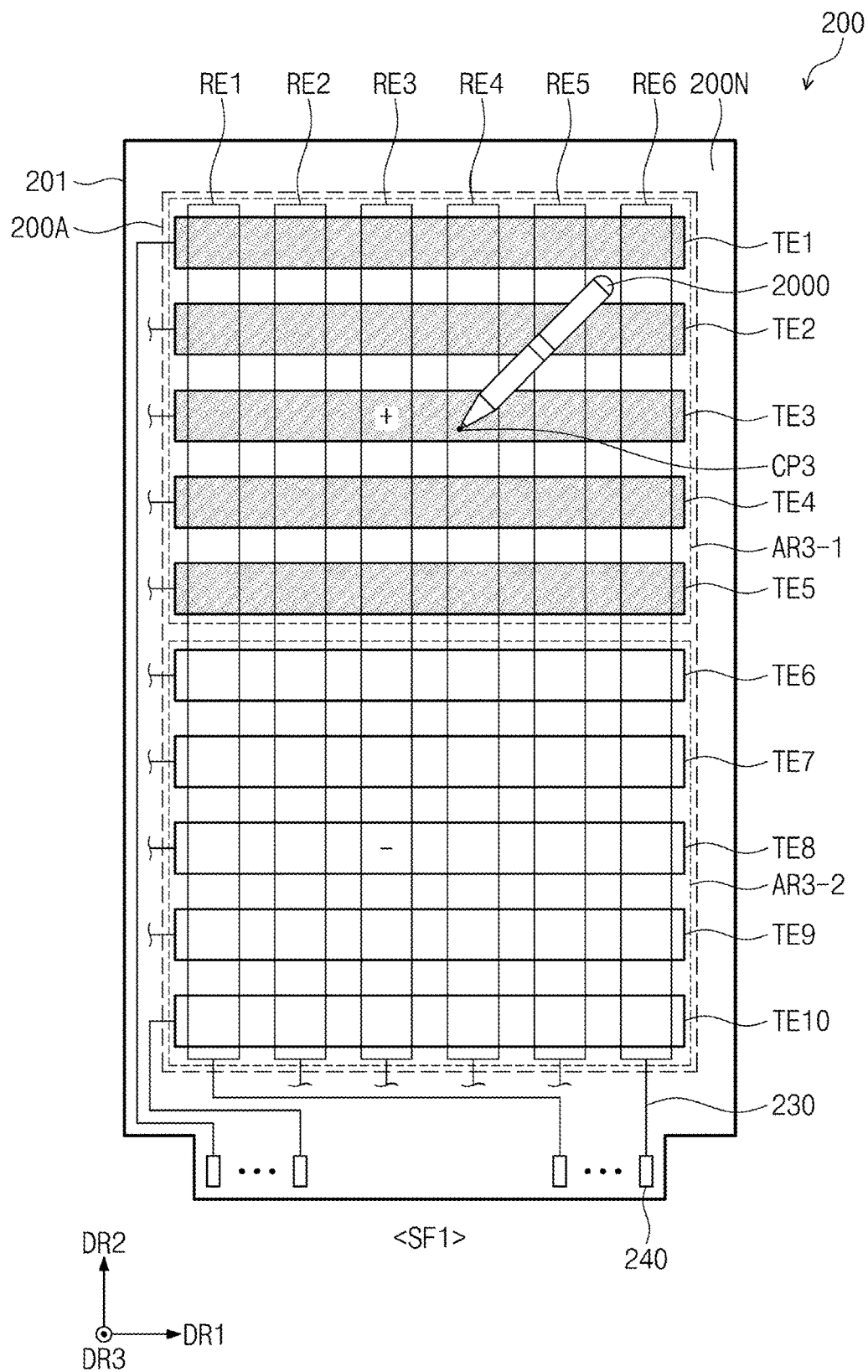
FIG. 12 is a plan view illustrating an operation of an input sensor in a second driving mode.
Figure 13A:
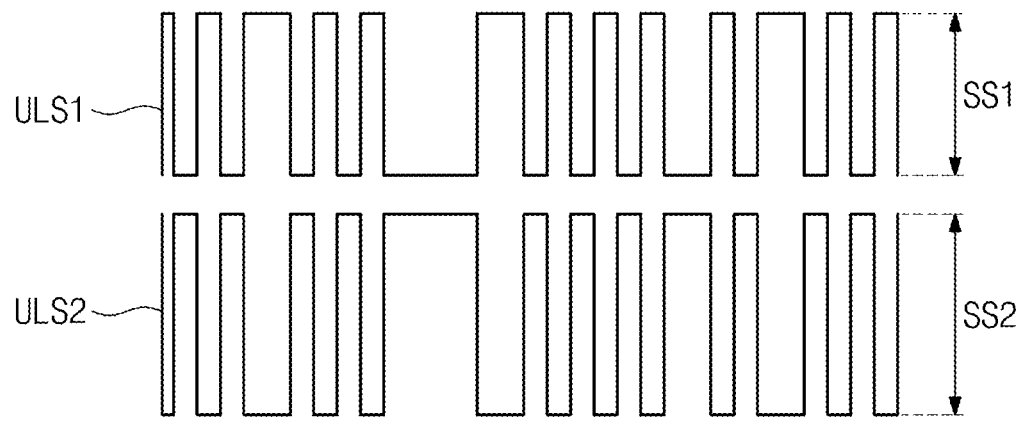
FIG. 13A is a waveform diagram illustrating first and second uplink signals shown in FIG. 9A.
Figure 13B:
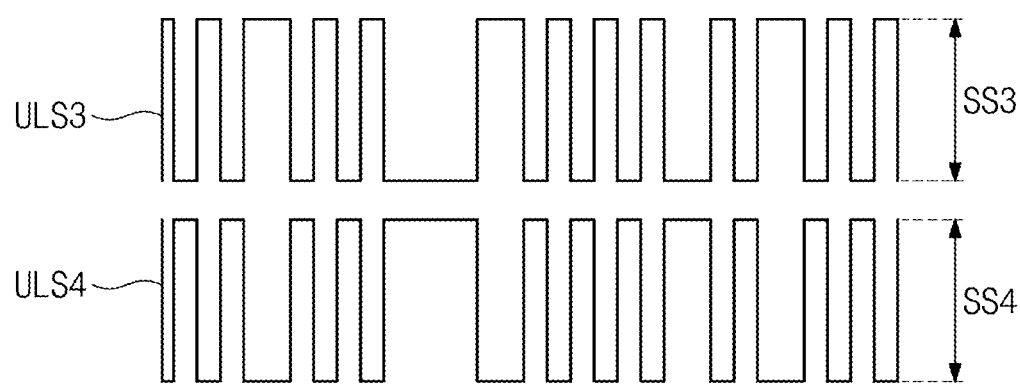
FIG. 13B is a waveform diagram illustrating third and fourth uplink signals shown in FIGS. 9A and 9B.

FIGS. 9A and 9B are waveform diagrams illustrating uplink signals according to some embodiments of the present disclosure. FIGS. 10A to 10D are plan views illustrating an operation of an input sensor in a first driving mode. FIGS. 11A and 11B are plan views illustrating an operation of an input sensor in a first driving mode. FIG. 12 is a plan view illustrating an operation of an input sensor in a second driving mode. FIG. 13A is a waveform diagram illustrating first and second uplink signals shown in FIG. 9A. FIG. 13B is a waveform diagram illustrating third and fourth uplink signals shown in FIGS. 9A and 9B.

Referring to FIGS. 3, 6, and 9A, a panel driver 100C may drive a display panel 100 at a first operating frequency in a first driving mode NM and may drive the display panel 100 at a second operating frequency in a second driving mode LM. The second operating frequency may be lower than the first operating frequency. For example, the second operating frequency may be a frequency of 1 Hz, 10 Hz, 15 Hz, 30 Hz, or 48 Hz, and the first operating frequency may be a frequency of 60 Hz, 120 Hz, or 240 Hz. As such, an operation mode where the operating frequency of the display panel 100 varies may be defined as a variable frequency mode.

In the first driving mode NM, the display panel 100 may display a first image (e.g., a moving image or the like) during a plurality of frames NDF1, NDF2, NDF3, and NDF4 (e.g., may be referred to as a "first driving frame" or a "normal driving frame"). In the second driving mode LM, the display panel 100 may display a second image (e.g., a still image or the like) during a plurality of frames LDF1 and LDF2 (e.g., may be referred to as a "second driving frame" or a "low-frequency driving frame"). A duration of each of the plurality of second driving frames LDF1 and LDF2 may be greater than a duration of each of the plurality of first driving frames NDF1, NDF2, NDF3, and NDF4.

Each of the plurality of second driving frames LDF1 and LDF2 may include a write frame SF1 (e.g., may be referred to as a "first sub-frame" or a "refresh frame") and a plurality of holding frames SF2 (e.g., may be referred to as "second sub-frames" or "bias frames"). According to some embodiments of the present disclosure, the write frame SF1 may be the same in duration as each of the plurality of first driving frames NDF1, NDF2, NDF3, and NDF4. Each of the plurality of holding frames SF2 may be the same in duration as each of the plurality of first driving frames NDF1, NDF2, NDF3, and NDF4 and the write frame SF1.

The duration of each of the plurality of first driving frames NDF1, NDF2, NDF3, and NDF4, the duration of the write frame SF1, and the duration of each of the plurality of holding frames SF2 may be determined according to or based on a frequency of a vertical synchronization signal Vsync. A data driver 100C3 may apply a data signal Vdata (e.g., may be referred to as a "normal data signal" or a "valid data signal") including image information to the display panel 100 during the write frame SF1. The data driver 100C3 may apply a data signal Vdc (e.g., may be referred to as a "black data signal" or a "bias data signal"), which does not include image information, to the display panel 100 during each holding frame SF2. The bias data signal Vdc may be a data signal having a black gray scale or a low gray scale.

The sensor controller 200C may drive the input sensor 200. According to some embodiments of the present disclosure, the operating frequency of the input sensor 200 may be synchronized with a first operating frequency of the display panel 100. When the driving mode of the display panel 100 switches from the first driving mode NM to the second driving mode LM or switches from the second driving mode LM to the first driving mode NM, the operating frequency of the input sensor 200 may be fixed to a specific frequency, for example, the first operating frequency. According to some embodiments of the present disclosure, when the first operating frequency of the display panel 100 is 60 Hz in the first driving mode NM, the operating frequency of the input sensor 200 may also be 60 Hz. Although the second operating frequency of the display panel 100 switches to 10 Hz in the second driving mode LM, the operating frequency of the input sensor 200 may be maintained as 60 Hz.

When the display panel 100 operates in the first driving mode NM, the sensor controller 200C may transmit a first mode uplink signal (e.g., a first uplink signal ULS1 and a second uplink signal ULS2) to the input sensor 200. Each of the first driving frames NDF1 may include an interval corresponding to a first interval PU1 where the first and second uplink signals ULS1 and ULS2 are transmitted. The state where the input sensor 200 operates in the first mode MD1 (refer to FIG. 7) is illustrated as an example in FIG. 9A. However, even when the input sensor 200 operates in a second mode MD2 (refer to FIG. 7), first and second uplink signals ULS1 and ULS2 may be transmitted to the input sensor 200 during a first interval PU2 (refer to FIG. 7).

The second uplink signal ULS2 may be a signal, a phase of which is delayed by 180° from the first uplink signal ULS1. Thus, the first and second uplink signals ULS1 and ULS2 may have inverted phases in the first interval PU1. When the first uplink signal ULS1 has positive polarity (+) in a portion of the first interval PU1, the second uplink signal ULS2 may have negative polarity (−). When the first uplink signal ULS1 has negative polarity (−) in another portion of the first interval PU1, the second uplink signal ULS2 may have positive polarity (+).

Referring to FIGS. 10A to 10D, the input sensor 200 may include a base insulating layer 201, a plurality of transmit electrodes TE1 to TE10, a plurality of receive electrodes RE1 to RE6, a plurality of trace lines 230, and a plurality of pads 240.

The plurality of transmit electrodes TE1 to TE10 and the plurality of receive electrodes RE1 to RE6 may be arranged in the sensing area 200A. The plurality of trace lines 230 and the plurality of pads 240 may be arranged in the non-sensing area 200N. 10 transmit electrodes TE1 to TE10 and 6 receive electrodes RE1 to RE6 are illustrated as an example in FIGS. 10A and 10B, but the number of transmit electrodes and the number of receive electrodes are not limited thereto.

Each of the plurality of transmit electrodes TE1 to TE10 and the plurality of receive electrodes RE1 to RE6 may be electrically connected with a corresponding trace line among the plurality of trace lines 230. A single routing structure where the one trace line 230 is connected with the one transmit electrode TE1 to TE10 and where the one trace line 230 is connected with the one receive electrode RE1 to RE6 is illustrated as an example in FIGS. 10A and 10B, but not particularly limited thereto. For example, the two trace lines 230 may be connected with each of the plurality of receive electrodes RE1 to RE6, and the one trace line 230 may be connected with each of the plurality of transmit electrodes TE1 to TE10. Furthermore, the two trace lines 230 may be connected with each of the plurality of electrodes RE1 to RE6, and the two trace lines 230 may be connected with each of the plurality of receive electrodes RE1 to RE6.

The plurality of pads 240 may be electrically connected with the plurality of trace lines 230, respectively. The input sensor 200 may be electrically connected with the sensor controller 200C through the plurality of pads 240. However, this is merely illustrative, and the plurality of pads 240 according to some embodiments of the present disclosure may be arranged in the display panel 100. In this case, the plurality of trace lines 230 may be electrically connected with the plurality of pads 240 through contact holes.

Figure 10A:
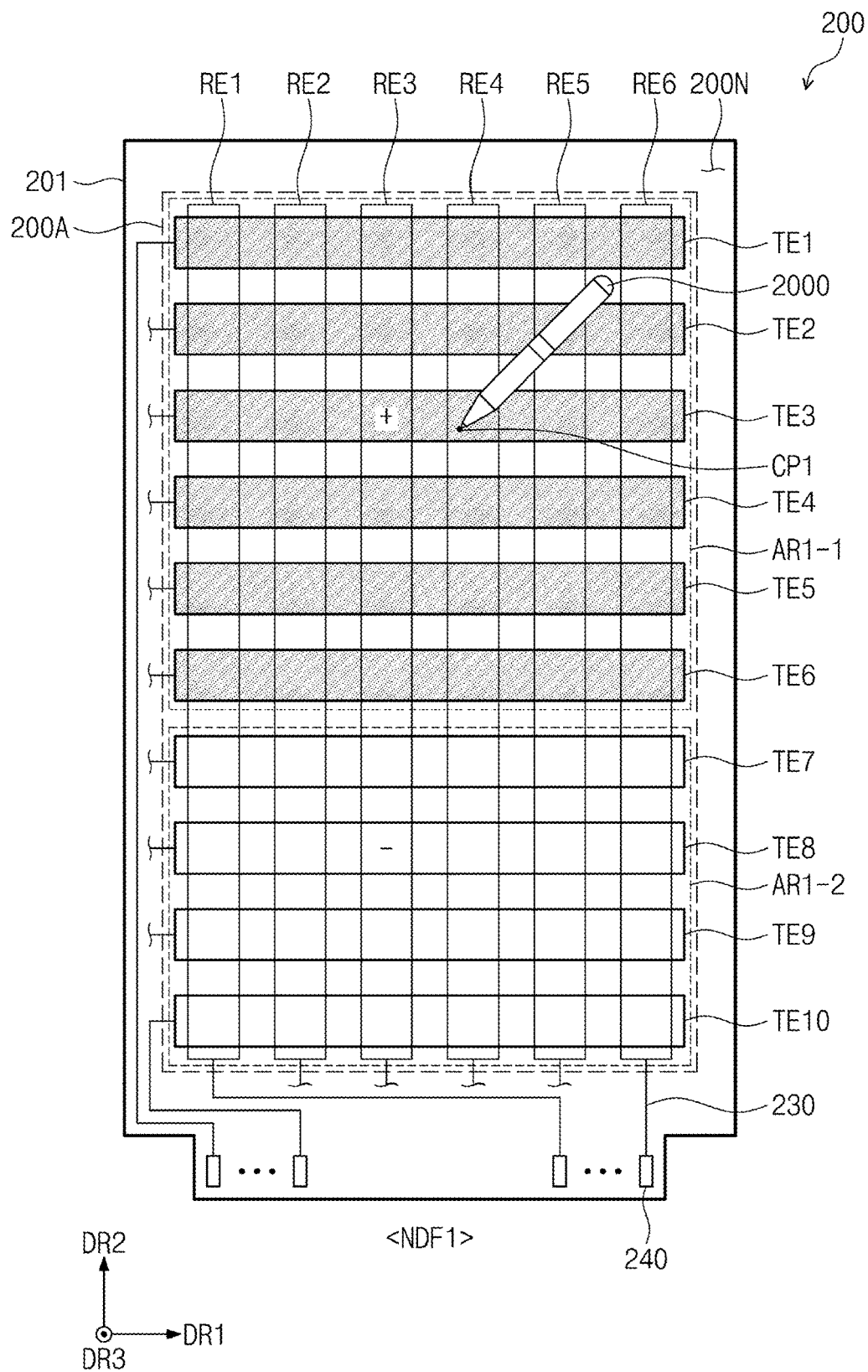
FIGS. 10A, 10B, 10C, and 10D are plan views illustrating an operation of an input sensor in a first driving mode.

Referring to FIG. 10A, the sensing area 200A of the input sensor 200 may include a first area AR1-1 and a second area AR1-2 in an odd-numbered first driving frame NDF1 of a first driving mode NM.

When the input device 2000 is arranged at a first position, the input sensor 200 may sense first coordinates CP1 corresponding to the first position. The sensor controller 200C may define the first area AR1-1 based on the first coordinates CP1. The first area AR1-1 may be overlapped with the first coordinates CP1. The first area AR1-1 may be a portion of the sensing area 200A, and the second area AR1-2 may be the rest of the sensing area 200A except for the first area AR1-1. The first and second areas AR1-1 and AR1-2 may be defined based on the plurality of transmit electrodes TE1 to TE10. The first uplink signal ULS1 may be provided to transmit electrodes (e.g., first to sixth transmit electrodes TE1 to TE6) located in the first area AR1-1. The second uplink signal ULS2 may be provided to transmit electrodes (e.g., seventh to tenth transmit electrodes TE7 to TE10) located in the second area AR1-2.

Alternatively, the first and second areas AR1-1 and AR1-2 may be defined in the sensing area 200A based on the plurality of receive electrodes RE1 to RE10. For example, an area which is overlapped with the fourth receive electrode RE4 overlapped with the first coordinates CP1 and is overlapped with the three and fifth receive electrodes RE3 and RE5 adjacent to the fourth receive electrode RE4 may be defined as a first area, and an area overlapped with the remaining receive electrodes (e.g., the first, second, and sixth receive electrodes RE1, RE2, and RE6) may be defined as a second area.

Figure 10B:
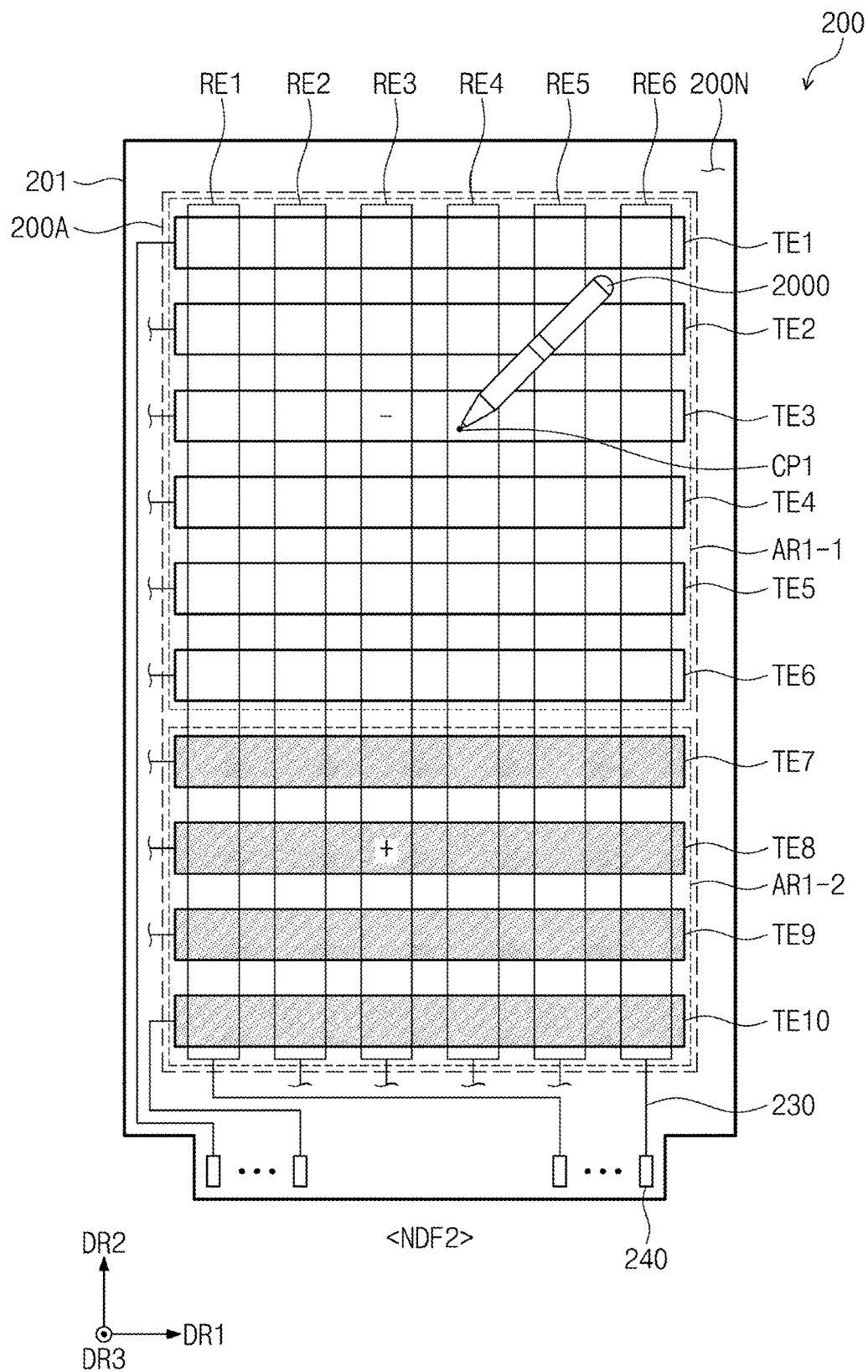

Referring to FIGS. 10B, the second uplink signal ULS2 may be provided to transmit electrodes (e.g., the first to sixth transmit electrodes TE1 to TE6) located in the first area AR1-1 during an even-numbered first driving frame NDF2 of the first driving mode NM. The first uplink signal ULS1 may be provided to transmit electrodes (e.g., the seventh to tenth transmit electrodes TE7 to TE10) located in the second area AR1-2.

Figure 10C:
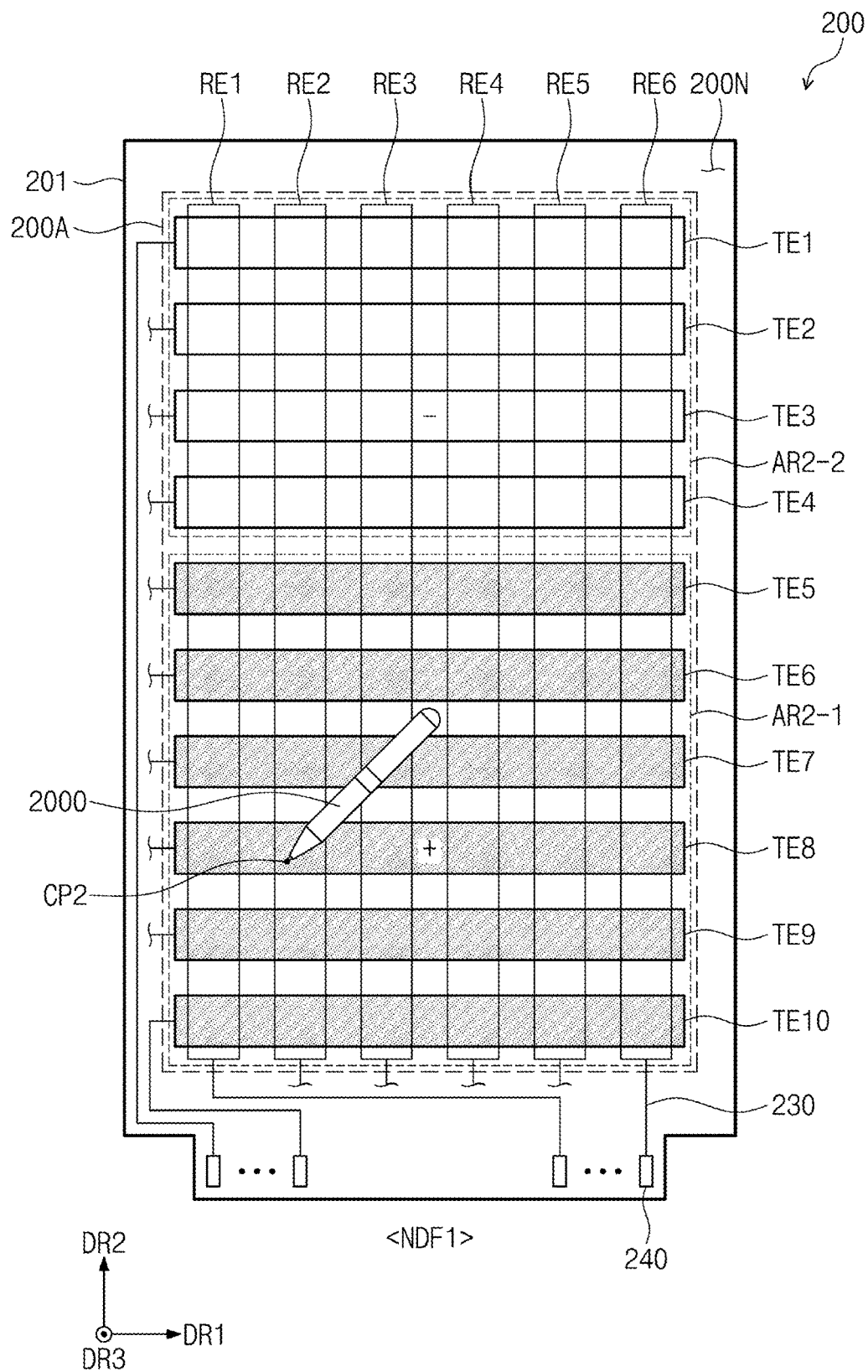

Referring to FIGS. 10C, when the input device 2000 is located at a second position, the input sensor 200 may sense second coordinates CP2 corresponding to the second position. The sensor controller 200C may define the first area AR2-1 and AR2-1 based on the second coordinates CP2. The first area AR2-1 may be a portion of the sensing area 200A overlapped with the second coordinates CP2, and the second area AR2-2 may be the rest of the sensing area 200A except for the first area AR2-1.

In an odd-numbered first driving frame NDF1 of the first driving mode NM, the first uplink signal ULS1 may be provided to transmit electrodes (e.g., the fifth to tenth transmit electrodes TE5 to TE10) located in the first area AR2-1. The second uplink signal ULS2 may be provided to transmit electrodes (e.g., first to fourth transmit electrodes TE1 to TE4) located in the second area AR2-2.

Figure 10D:
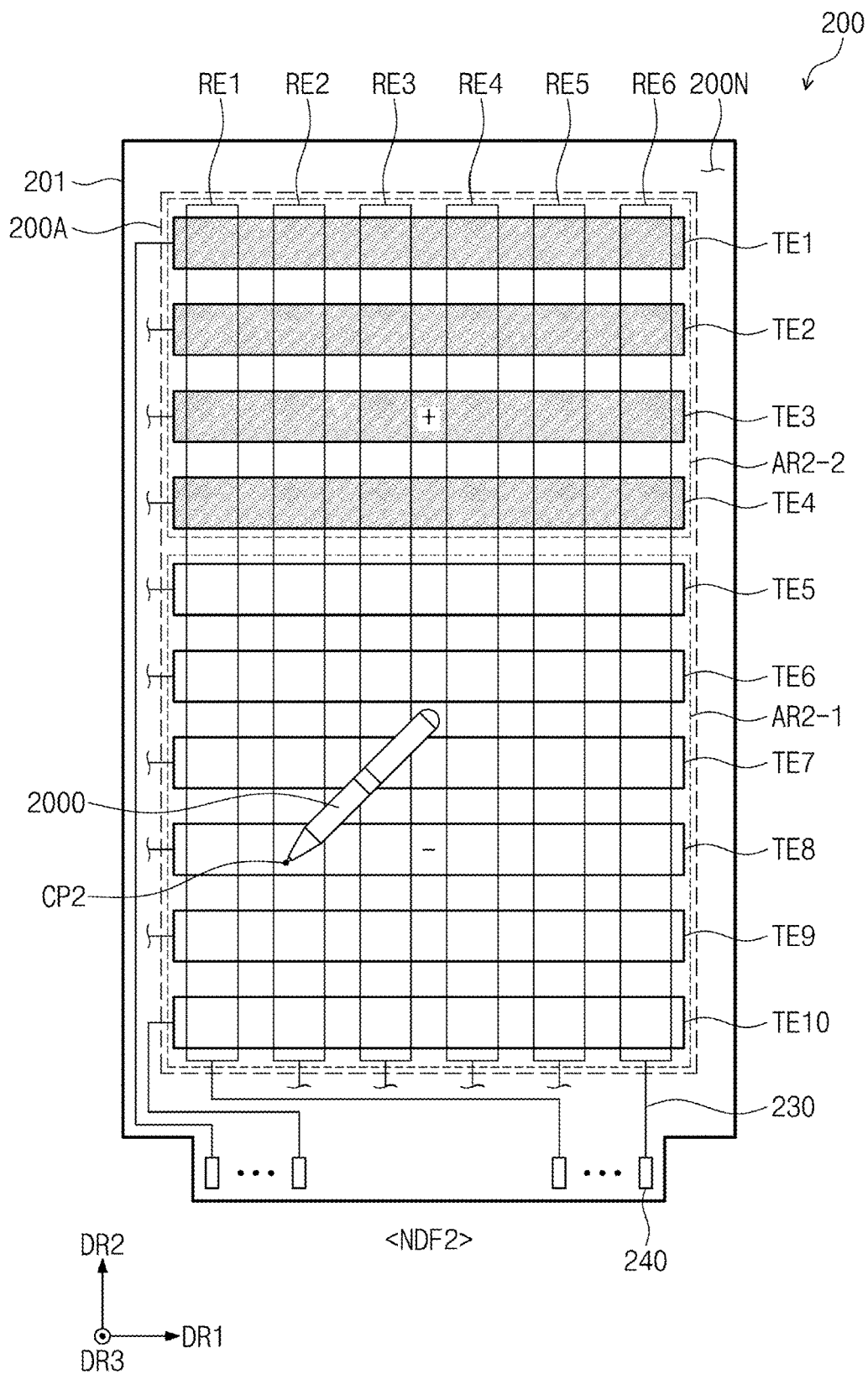

Referring to FIGS. 10D, the second uplink signal ULS2 may be provided to transmit electrodes (e.g., fifth to tenth transmit electrodes TE5 to TE10) located in the first area AR2-1 during an even-numbered first driving frame NDF2 of the first driving mode NM. The first uplink signal ULS1 may be provided to transmit electrodes (e.g., the first to fourth transmit electrodes TE1 to TE4) located in the second area AR2-2.

The first area AR1-1 or AR2-1 and the second area AR1-2 or AR2-2 may differ in area from each other in the first driving mode NM. As shown in FIG. 13A, an intensity SS1 of the first uplink signal ULS1 and an intensity SS2 of the second uplink signal ULS2 may be different from each other. The case where the intensity SS2 of the second uplink signal ULS2 is greater than the intensity SS1 of the first uplink signal ULS1 is illustrated as an example in FIG. 13A. However, the intensity SS2 of the second uplink signal ULS2 and the intensity SS1 of the first uplink signal ULS1 according to some embodiments of the present disclosure are not limited thereto. For example, the intensity SS2 of the second uplink signal ULS2 may be less than the intensity SS1 of the first uplink signal ULS1. Alternatively, the intensity SS2 of the second uplink signal ULS2 may be the same as the intensity SS1 of the first uplink signal ULS1.

The sensor controller 200C may control areas of the first area AR1-1 and AR2-1 and the second areas AR1-2 and AR2-2 and intensities SS1 and SS2 of the first and second uplink signals ULS1 and ULS2, thus controlling a degree to which ripples generated at the potential of a second electrode CE (refer to FIG. 5) by the first and second uplink signals ULS1 and ULS2 are offset with each other.

When viewed from the two first driving frames NDF1 and NDF2, the first and second uplink signals ULS1 and ULS2, each of which has an inverted phase, may be provided to the first area AR1-1 and the second and first uplink signals ULS2 and ULS1, each of which has an inverted phase, may be provided to the second area AR1-2. Thus, although a ripple is generated at the potential of a second electrode CE due to parasitic capacitance Cb (refer to FIG. 5) between the input sensor 200 and the second electrode CE, when viewed from the two first driving frames NDF1 and NDF2, an effect in which the ripple is offset may occur. Thus, a flicker due to the parasitic capacitance Cb may be removed. As a result, display quality of the display panel 100 may be relatively improved in the first driving mode NM.

Hereinafter, a scheme where the first and second uplink signals ULS1 and ULS2 are alternately applied to the first area AR1-1 in units of two first driving frames NDF1 and NDF2 and where the second and first uplink signals ULS2 and ULS1 are alternately applied to the second area AR1-2 may be referred to as a first charge cancellation scheme.

Referring to FIGS. 9B, 11A, and 11B, when the display panel 100 operates the first driving mode NM, the sensor controller 200C (refer to FIG. 8) may transmit an uplink signal ULS to the input sensor 200. Hereinafter, for convenience of description, an interval overlapped with odd-numbered first driving frames NDF1 and NDF3 in a first interval PU1 (refer to FIG. 7) where the uplink signal ULS is transmitted may be referred to as a first sub-interval PUa, and an interval overlapped with an even-numbered first driving frames NDF2 and NDF4 may be referred to as a second sub-interval PUb.

The phase of the uplink signal ULS in the first sub-interval PUa may be inverted from the phase of the uplink signal ULS in the second sub-interval PUb. In other words, the phase of the uplink signal ULS may be inverted in units of one first driving frame NDF1 to NDF4. The uplink signal ULS applied to the input sensor 200 during the odd-numbered first driving frames NDF1 and NDF3 may have a phase delayed by 180° with the uplink signal ULS applied to the input sensor 200 during the even-numbered first driving frames NDF2 and NDF4. The sensor controller 200C may output an uplink signal ULS having a positive phase during the first sub-interval PUa and may output an uplink signal ULS having a reverse phase or a negative phase during the second sub-interval PUb. The first and second sub-intervals PUa and PUb may be alternately arranged.

When the sensor controller 200C applies one uplink signal ULS to the input sensor 200, the sensing area 200A may fail to be divided into first and second areas.

As shown in FIG. 11A, in the odd-numbered first driving frame NDF1 of the first driving mode NM, the uplink signal ULS having the positive phase may be provided to all transmit electrodes (e.g., first to tenth transmit electrodes TE1 to TE10) located in the sensing area 200A. As shown in FIG. 11B, the uplink signal ULS having the reverse phase or the negative phase may be provided to all the transmit electrodes (e.g., the first to tenth transmit electrodes TE1 to TE10) located in the sensing area 200A during the even-numbered first driving frame NDF2 of the first driving mode NM.

When viewed from the two first driving frames NDF1 and NDF2, an uplink signal ULS having an inverted phase may be provided to the sensing area 200A. Thus, although a ripple is generated at the potential of the second electrode CE (refer to FIG. 5) due to the parasitic capacitance Cb (refer to FIG. 5) between the input sensor 200 and the second electrode CE, when viewed from the two first driving frames NDF1 and NDF2, an effect in which the ripple is offset may occur. Thus, a flicker due to the parasitic capacitance Cb may be removed. As a result, display quality of the display panel 100 may be relatively improved in the first driving mode NM.

Hereinafter, a scheme where the uplink signal ULS with the positive phase and the reverse phase or the negative phase is applied to the sensing area 200A in units of the two first driving frames NDF1 and NDF2 may be referred to as a temporal averaging scheme.

Because a period where the write frame SF1 is generated increases when the first driving mode NM switches to the second driving mode LM, it is difficult to offset a ripple generated at the potential of the second electrode CE by adopting the first charge cancellation scheme and the temporal averaging scheme. Thus, according to some embodiments of the present disclosure, a ripple generated at the potential of the second electrode CE may be offset in a scheme (e.g., a second charge cancellation scheme) different from the first charge cancellation scheme and the temporal averaging scheme in the second driving mode LM.

Referring to FIGS. 9A, 9B, and 12, when the display panel 100 operates in the second driving mode LM, the sensor controller 200C (refer to FIG. 8) may transmit a second mode uplink signal (e.g., a third uplink signal ULS3 and a fourth uplink signal ULS4) to the input sensor 200 during the write frame SF1. An interval corresponding to the first interval PU1 where the third and fourth uplink signals ULS3 and ULS4 are transmitted may be included in the write frame SF1. The state where the input sensor 200 operates in the first mode MD1 (refer to FIG. 7) is illustrated as an example in FIGS. 9A and 9B. However, even when the input sensor 200 operates in a second mode MD2 (refer to FIG. 7), the third and fourth uplink signals ULS3 and ULS4 may be transmitted to the input sensor 200 during a first interval PU2 (refer to FIG. 7).

The fourth uplink signal ULS4 may have a phase inverted from the third uplink signal ULS3 in the first interval PU1. According to some embodiments of the present disclosure, the fourth uplink signal ULS4 may be a signal, a phase of which is more delayed by 180° than the third uplink signal ULS3. When the third uplink signal ULS3 has positive polarity (+) in a portion of the first interval PU1, the fourth uplink signal ULS4 may have negative polarity (−). When the third uplink signal ULS3 has negative polarity (−) in another portion of the first interval PU1, the fourth uplink signal ULS4 may have positive polarity (+).

The sensing area 200A of the input sensor 200 may be divided into the third and fourth areas AR3-1 and AR3-2 during the write frame SF1 of the second driving mode LM.

When the input device 2000 is located at a third position, the input sensor 200 may sense third coordinates CP3 corresponding to the third position. The sensor controller 200C may define the third area AR3-1 based on the third coordinates CP3. The third area AR3-1 may be overlapped with the third coordinates CP3. The third area AR3-1 may be a portion of the sensing area 200A, and the fourth area AR3-2 may be the rest of the sensing area 200A except for the third area AR3-1. The third and fourth areas AR3-1 and AR3-2 may be defined based on the plurality of transmit electrodes TE1 to TE10. The third uplink signal ULS3 may be provided to transmit electrodes (e.g., the first to fifth transmit electrodes TE1 to TE5) located in the third area AR3-1. The fourth uplink signal ULS4 may be provided to transmit electrodes (e.g., the sixth to tenth transmit electrodes TE6 to TE10) located in the fourth area AR3-2.

The third area AR3-1 and the fourth area AR3-2 may be the same in area as each other in the second driving mode LM. The third area AR3-1 and the fourth area AR3-2 in the second driving mode may differ in area from the first areas AR1-1 and AR2-1 and the second areas AR1-2 and AR2-2 in the first driving mode NM. As shown in FIG. 13B, an intensity SS3 of the third uplink signal ULS3 and an intensity SS4 of the fourth uplink signal ULS4 may be the same as each other. The third and fourth uplink signals ULS3 and ULS4, each of which has an inverted phase, may be applied to the third and fourth areas AR3-1 and AR3-2, respectively. When an area between the third area AR3-1 and the fourth area AR3-2 is balanced in the second driving mode LM and when an intensity between the third and fourth uplink signals ULS3 and ULS4 is balanced, a ripple may be offset in one write frame SF1.

Thus, although a ripple is generated at the potential of the second electrode CE (refer to FIG. 5) due to the parasitic capacitance Cb (refer to FIG. 5) between the input sensor 200 and the second electrode CE, an effect in which the ripple is offset may occur in the one write frame SF1. Thus, a flicker due to the parasitic capacitance Cb may be removed. As a result, display quality of the display panel 100 may be relatively improved in the second driving mode LM.

According to some embodiments of the present disclosure, unlike the first charge cancellation scheme and the temporal averaging scheme, which may remove the ripple on the basis of the two first driving frames, the scheme (i.e., the second charge cancellation scheme) capable of removing the ripple in the one write frame SF1 in the second driving mode LM may be adopted. In other words, when the ripple generated at the potential of the second electrode CE is removed after the two first driving frames NDF1 and NDF2 elapse in the first charge cancellation scheme and the temporal averaging scheme adopted in the first driving mode NM, whereas the ripple generated at the potential of the second electrode CE may be removed in the one write frame SF1 in the second charge cancellation scheme.

Thus, although the operating frequency of the display panel 100 is low in the second driving mode LM, a ripple offset scheme may be changed and applied to the input sensor 200, thus stably removing a flicker phenomenon due to the uplink signals ULS3 and ULS4 in the second driving mode LM. As a result, display quality may be relatively improved.

Meanwhile, the sensor controller 200C may apply a fifth uplink signal ULS5 to the input sensor 200 in response to each of holding frames SF2 during the second driving mode LM. The fifth uplink signal ULS5 may be a normal uplink signal to which the temporal averaging scheme, the first and second charge cancellation schemes, and the like are not applied. In other words, the normal uplink signal may be generated to have the same phase for each holding frame SF2. The data driver 100C3 (refer to FIG. 6) may output a bias data signal Vdc having a certain potential at a black gray scale or a low gray scale in each holding frame SF2. Furthermore, the scan driver 100C2 (refer to FIG. 6) may be maintained in an inactive state in the holding frame SF2.

Thus, when the fifth uplink signal ULS5 is applied to the input sensor 200 in the holding frame SF2, although a ripple is generated at the potential of the second electrode CE, a flicker may fail to be viewed on an image displayed on the display panel 100 (refer to FIG. 6). Thus, the ripple offset scheme such as the temporal averaging scheme and the first and second charge cancellation schemes may fail to be applied in the holding frame SF2.

Figure 14A:
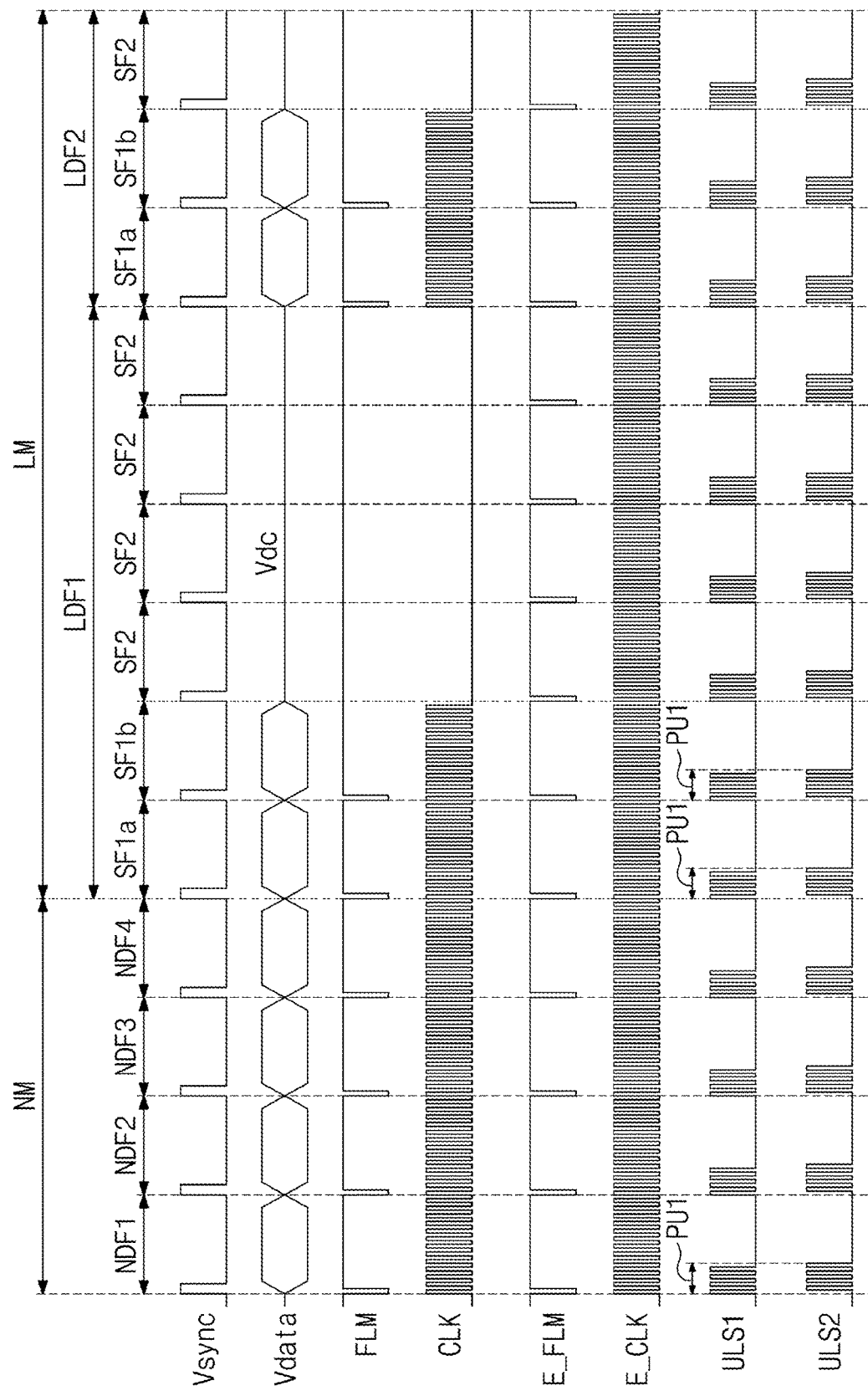
FIG. 14A is a waveform diagram illustrating a scan control signal, a light emitting control signal, and first and second uplink signals according to some embodiments of the present disclosure.
Figure 14B:
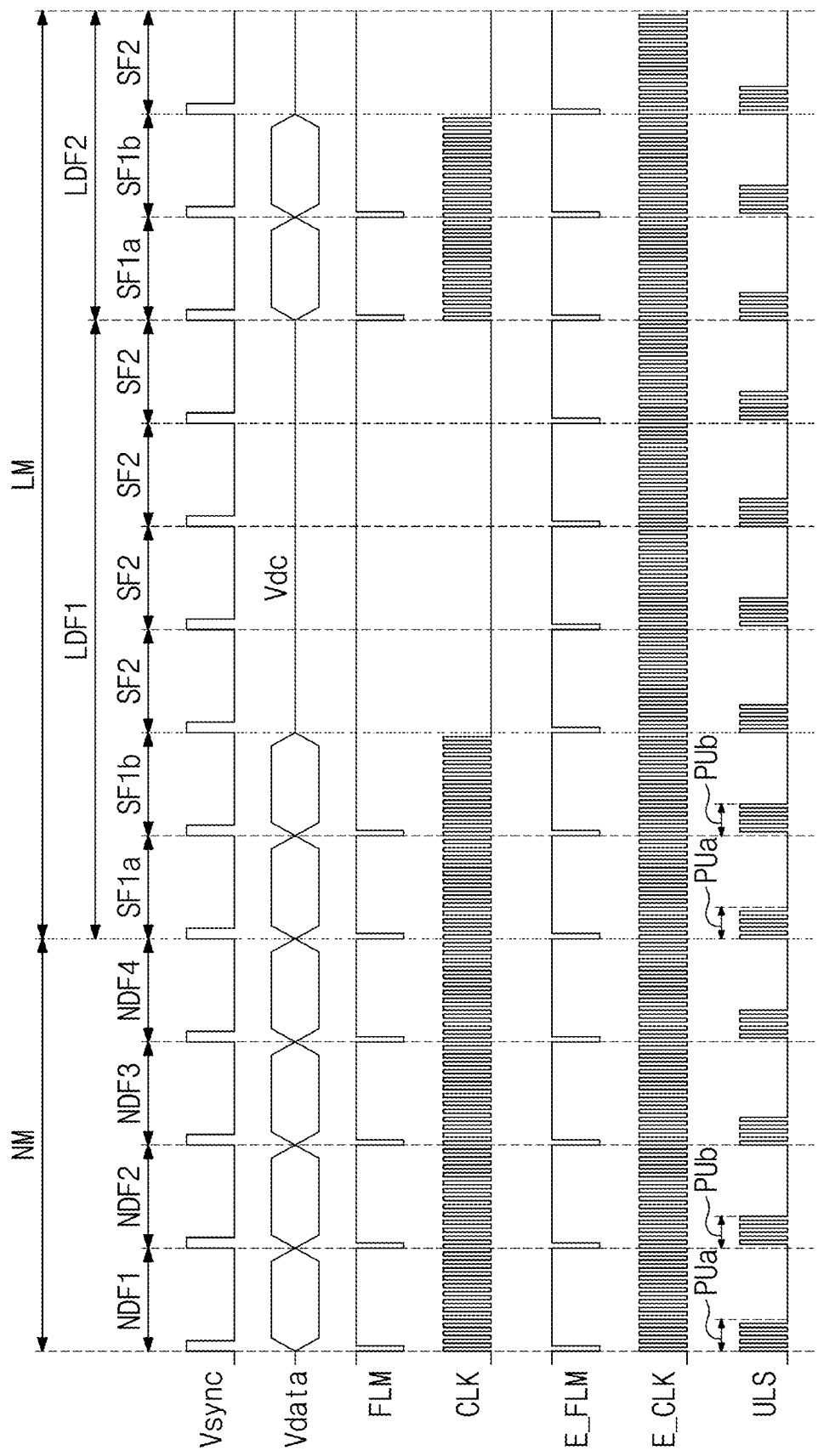
FIG. 14B is a waveform diagram illustrating a scan control signal, a light emitting control signal, and an uplink signal according to some embodiments of the present disclosure.
Figure 15A:
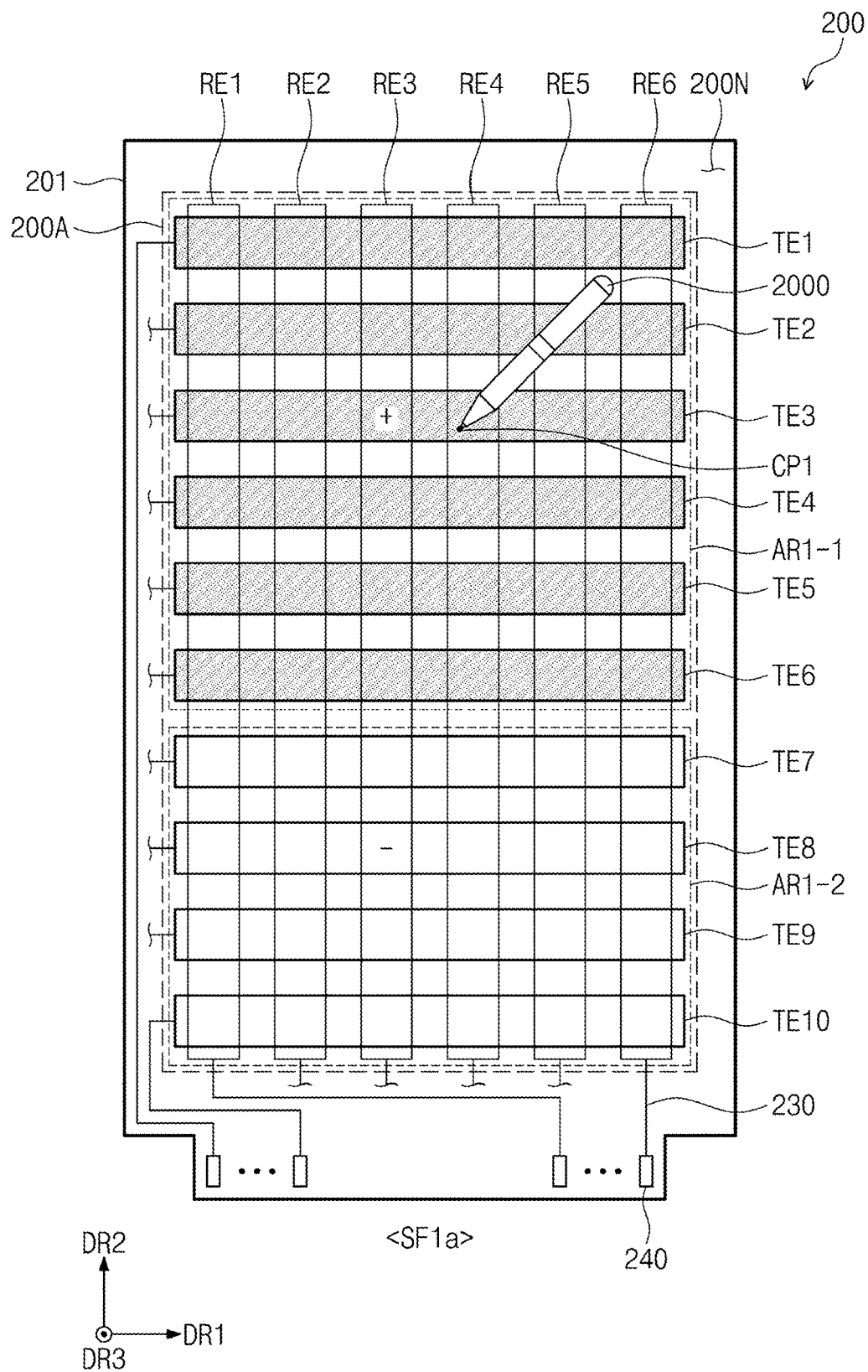
FIG. 15A is a plan view illustrating an operation of an input sensor in a first write frame shown in FIG. 14A.
Figure 15B:
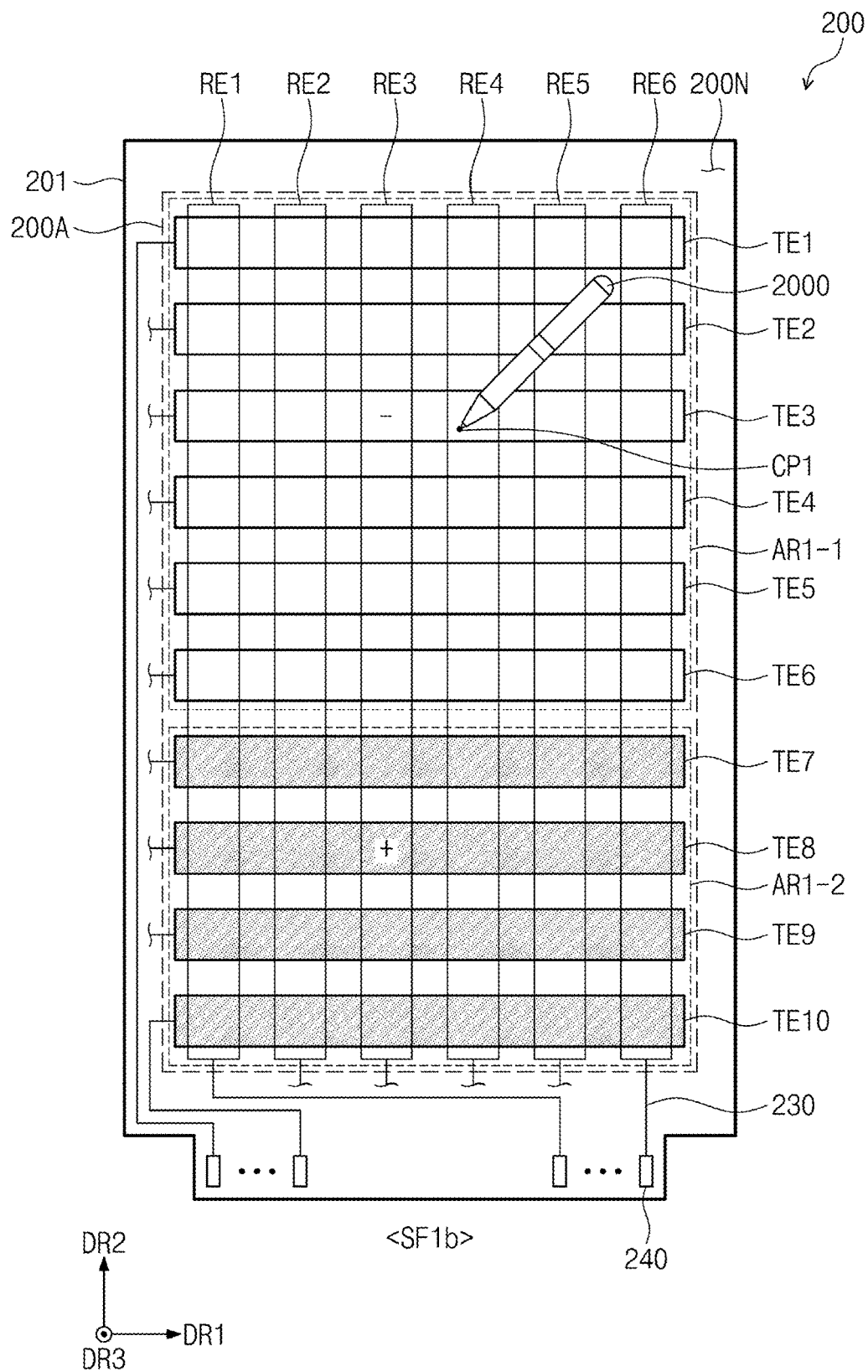
FIG. 15B is a plan view illustrating an operation of an input sensor in a second write frame shown in FIG. 14A.
Figure 15C:
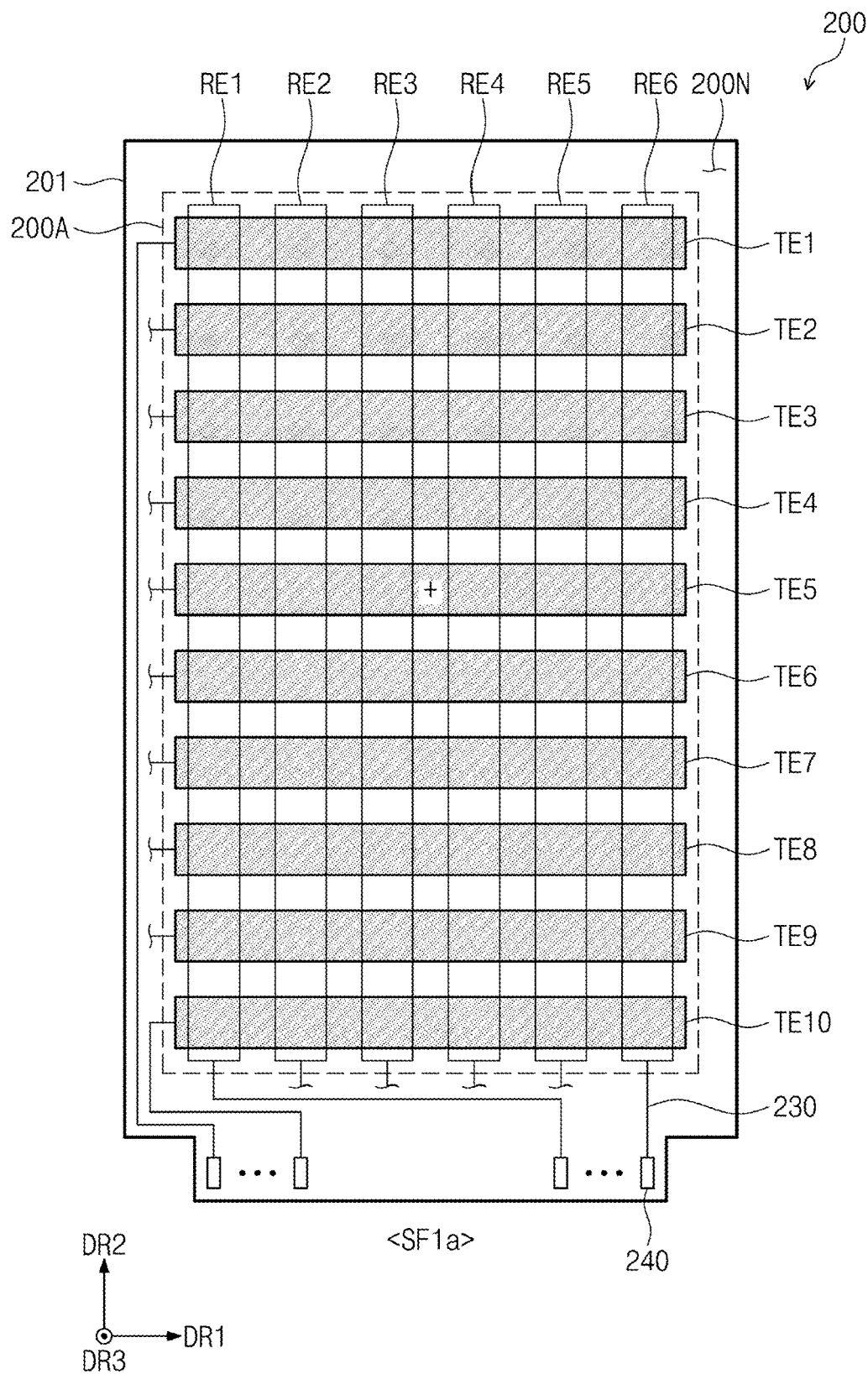
FIG. 15C is a plan view illustrating an operation of an input sensor in a first write frame shown in FIG. 14B.
Figure 15D:
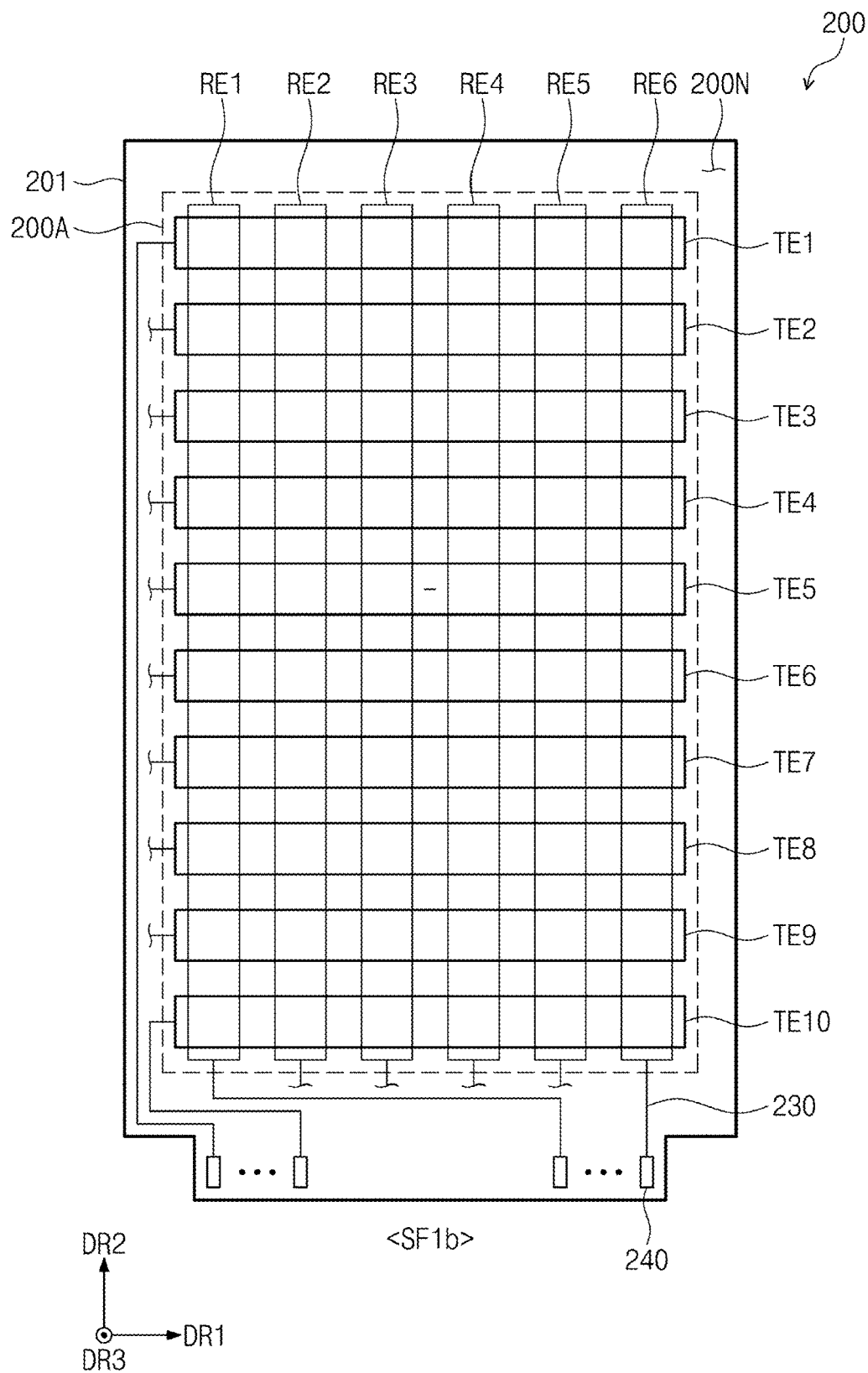
FIG. 15D is a plan view illustrating an operation of an input sensor in a second write frame shown in FIG. 14B.

FIG. 14A is a waveform diagram illustrating a scan control signal, a light emitting control signal, and first and second uplink signals according to some embodiments of the present disclosure. FIG. 14B is a waveform diagram illustrating a scan control signal, a light emitting control signal, and an uplink signal according to some embodiments of the present disclosure. FIG. 15A is a plan view illustrating an operation of an input sensor in a first write frame shown in FIG. 14A. FIG. 15B is a plan view illustrating an operation of an input sensor in a second write frame shown in FIG. 14A. FIG. 15C is a plan view illustrating an operation of an input sensor in a first write frame shown in FIG. 14B. FIG. 15D is a plan view illustrating an operation of an input sensor in a second write frame shown in FIG. 14B.

Operations of a display panel 100 (refer to FIG. 6) and an input sensor 200 in a first driving mode NM in FIGS. 14A and 14B are duplicated with the contents described with reference to FIGS. 9A and 9B. Thus, a description of a detailed operation in the first driving mode NM will be omitted.

Referring to FIGS. 3, 6, and 14A, each of a plurality of second driving frames LDF1 and LDF2 may include k write frames and j holding frames. According to some embodiments of the present disclosure, k may be an even number of two or more and j may be a number greater than k. The case where two write frames (e.g., a first write frame SF1a and a second write frame SF1b) are included is illustrated according to some embodiments of the present disclosure in FIG. 14A, but the number of write frames is not limited thereto. Furthermore, the case where four holding frames SF2 are included is illustrated according to some embodiments of the present disclosure in FIG. 14A, but the number of holding frames is not limited thereto. The number of write frames and the number holding frames may vary with a second operating frequency. For example, the lower the second operating frequency, the more the number of k and the number of j may increase.

A data driver 100C3 (refer to FIG. 6) may apply a data signal Vdata (e.g., may be referred to as a "normal data signal" or a "valid data signal") including image information to the display panel 100 in each of the first and second write frames SF1a and SF1b. The data driver 100C3 may apply a data signal Vdc (e.g., may be referred to as a "black data signal" or a "bias data signal"), which does not include image information, to the display panel 100 during each holding frame SF2. The bias data signal Vdc may be a data signal having a black gray scale or a low gray scale.

In the second driving mode LM, a scan driver 100C2 (refer to FIG. 6) may be activated during k write frames and may be deactivated during j holding frames. A light emitting driver 100C4 (refer to FIG. 6) may be activated during the k write frames and the j holding frames. A scan control signal CONT1 provided to the scan driver 100C2 may include a scan start signal FLM and a scan clock signal CLK. A light emitting control signal CONT3 provided to the light emitting driver 100C4 may include a light emitting start signal E_FLM and a light emitting clock signal E_CLK.

The scan start signal FLM and the scan clock signal CLK may be activated in each of the first and second write frames SF1a and SF1b. Thus, the scan driver 100C2 is activated in only one write frame SF1 in the embodiments shown in FIG. 9A, whereas the scan driver 100C2 may be activated during two write frames SF1a and SF1b in the embodiments shown in FIG. 14A. According to some embodiments of the present disclosure, the scan driver 100C2 may be deactivated during each holding frame SF2. Meanwhile, the light emitting driver 100C4 may be activated in the first and second write frames SF1a and SF1b and may also be activated during each holding frame SF2. Thus, an image including image information may be displayed in the first and second write frames SF1a and SF1b, and a new image may not be displayed on the display panel 100 as the scan driver 100C2 is deactivated in the holding frame SF2 and the image may be maintained.

Referring to FIGS. 14A, 15A, and 15B, when the display panel 100 operates in the second driving mode LM, a sensor controller 200C (refer to FIG. 8) may transmit a first uplink signal ULS1 and a second uplink signal ULS2 to an input sensor 200 during the first write frame SF1a. An interval corresponding to a first interval PU1 where the first and second uplink signals ULS1 and ULS2 are transmitted may be included in the first write frame SF1a. The first and second uplink signals ULS1 and ULS2 may be the same as signals provided to the input sensor 200 in the first driving mode NM.

Thus, the first and second uplink signals ULS1 and ULS2 may have inverted phases in the first interval PU1. For example, the second uplink signal ULS2 may be a signal, a phase of which is delayed by 180° from the first uplink signal ULS1.

A sensing area 200A of the input sensor 200 may include first and second areas AR1-1 and AR1-2 in the first write frame SF1a of the second driving mode LM. The first uplink signal ULS1 may be provided to transmit electrodes (e.g., first to sixth transmit electrodes TE1 to TE6) located in the first area AR1-1. The second uplink signal ULS2 may be provided to transmit electrodes (e.g., seventh to tenth transmit electrodes TE7 to TE10) located in the second area AR1-2.

Meanwhile, the second uplink signal ULS2 may be provided to transmit electrodes (e.g., the first to sixth transmit electrodes TE1 to TE6) located in the first area AR1-1 in the second write frame SF1b of the second driving mode LM. The first uplink signal ULS1 may be provided to transmit electrodes (e.g., the seventh to tenth transmit electrodes TE7 to TE10) located in the second area AR1-2.

The first area AR1-1 and the second area AR1-2 may differ in area from each other in the second driving mode LM. An intensity SS1 of the first uplink signal ULS1 and an intensity SS2 of the second uplink signal ULS2 may be the same as or different from each other.

Each of the driving frames LDF1 and LDF2 of the second driving mode LM may include an even number of write frames, for example, the two write frames SF1a and SF1b. When viewed from the two write frames SF1a and SF1b, the first and second uplink signals ULS1 and ULS2, each of which has an inverted phase, may be provided to the first area AR1-1 and the second and first uplink signals ULS2 and ULS1, each of which has an inverted phase, may be provided to the second area AR1-2. Thus, although a ripple is generated at the potential of a second electrode CE (refer to FIG. 5) due to parasitic capacitance Cb (refer to FIG. 5) between the input sensor 200 and the second electrode CE, when viewed from the two write frames SF1a and SF1b, an effect in which the ripple is offset may occur.

When the ripple generated at the potential of the second electrode CE is offset in a first charge cancellation scheme in the first driving mode NM, a ripple generated at the potential of the second electrode CE may also be offset in the first charge cancellation scheme in the second driving mode LM. In other words, when an even number of write frames are provided although the first driving mode NM switches to the second driving mode LM, the ripple generated at the potential of the second electrode CE may be offset by applying the same scheme as the first driving mode NM.

Thus, although the operating frequency of the display panel 100 (refer to FIG. 6) changes, the ripple generated at the potential of the second electrode CE may be offset in the same scheme. As a result, a flicker due to parasitic capacitance Cb may be removed in the second driving mode LM and display quality of the display panel 100 may be relatively improved.

Referring to FIGS. 14B, 15C, and 15D, when the display panel 100 operates in the second driving mode LM, the sensor controller 200C may transmit the same uplink signal ULS as that in the first driving mode NM to the input sensor 200 during each of the second driving frames LDF1 and LDF2. Hereinafter, for convenience of description, an interval overlapped with odd-numbered first driving frames NDF1 and NDF3 and the first write frame SF1a in a first interval PU1 (refer to FIG. 7) where the uplink signal ULS is transmitted may be referred to as a first sub-interval PUa, and an interval overlapped with an even-numbered first driving frames NDF2 and NDF4 and the second write frame SF1b may be referred to as a second sub-interval PUb.

The phase of the uplink signal ULS in the first sub-interval PUa may be inverted from the phase of the uplink signal ULS in the second sub-interval PUb. In other words, the phase of the uplink signal ULS may be inverted in units of one first driving frame NDF1, NDF2, NDF3, or NDF4 in the first driving mode NM. The phase of the uplink signal ULS may be inverted in units of one write frame SF1a or SF1b or in units of one holding frame SF2 in the second driving mode LM. For example, the uplink signal ULS applied to the input sensor 200 during the first write frame SF1a may have a phase delayed by 180° with the uplink signal ULS applied to the input sensor 200 during the second write frame SF1b. The sensor controller 200C may output an uplink signal ULS having a positive phase during the first sub-interval PUa and may output an uplink signal ULS having a reverse phase or a negative phase during the second sub-interval PUb. The first and second sub-intervals PUa and PUb may be alternately arranged.

When the sensor controller 200C applies one uplink signal ULS to the input sensor 200, the sensing area 200A may fail to be divided into first and second areas.

As shown in FIG. 15C, in the first write frame SF1a of the second driving mode LM, the uplink signal ULS having the positive phase may be provided to all transmit electrodes (e.g., first to tenth transmit electrodes TE1 to TE10) located in the sensing area 200A. As shown in FIG. 15D, in the second write frame SF1b of the second driving mode LM, the uplink signal ULS having the reverse phase or the negative phase may be provided to all transmit electrodes (e.g., the first to tenth transmit electrodes TE1 to TE10) located in the sensing area 200A.

When viewed from the two write frames SF1a and SF1b, an uplink signal ULS having an inverted phase may be provided to the sensing area 200A. Thus, although a ripple is generated at the potential of the second electrode CE (refer to FIG. 5) due to parasitic capacitance Cb (refer to FIG. 5) between the input sensor 200 and the second electrode CE, when viewed from the two write frames SF1a and SF1b, an effect in which the ripple is offset may occur. Thus, a flicker due to the parasitic capacitance Cb may be removed. As a result, display quality of the display panel 100 may be relatively improved in the second driving mode LM.

When the ripple generated at the potential of the second electrode CE is offset in a temporal averaging scheme in the first driving mode NM, a ripple generated at the potential of the second electrode CE may also be offset in the temporal averaging scheme in the second driving mode LM. In other words, when an even number of write frames are provided although the first driving mode NM switches to the second driving mode LM, the ripple generated at the potential of the second electrode CE may be offset by applying the same scheme as the first driving mode NM.

Thus, although the operating frequency of the display panel 100 changes, the ripple generated at the potential of the second electrode CE may be offset in the same scheme. As a result, a flicker due to parasitic capacitance Cb may be removed in the second driving mode LM and display quality of the display panel 100 may be relatively improved.

Figure 16A:
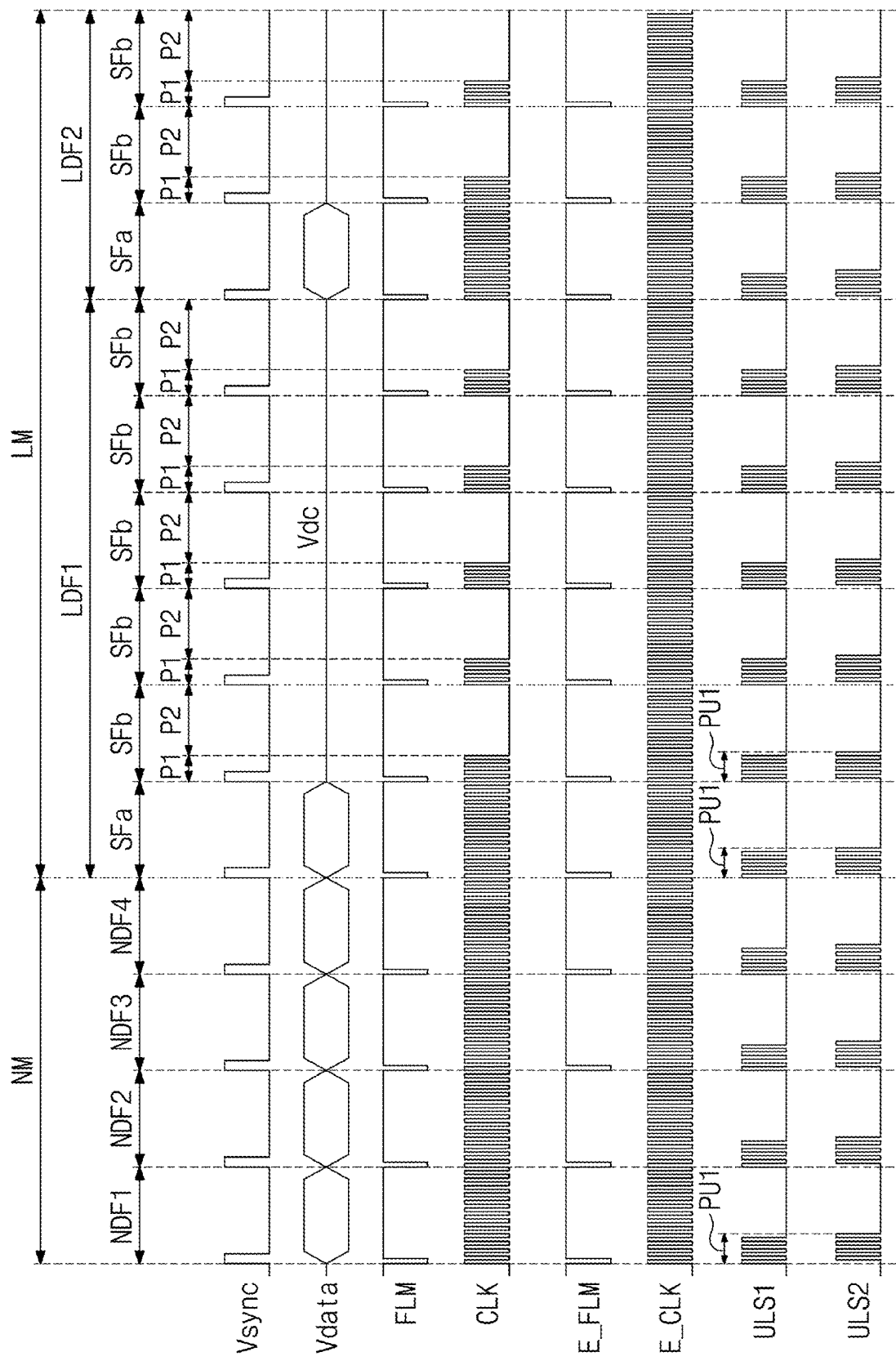
FIG. 16A is a waveform diagram illustrating a scan control signal, a light emitting control signal, and first and second uplink signals according to some embodiments of the present disclosure.
Figure 16B:
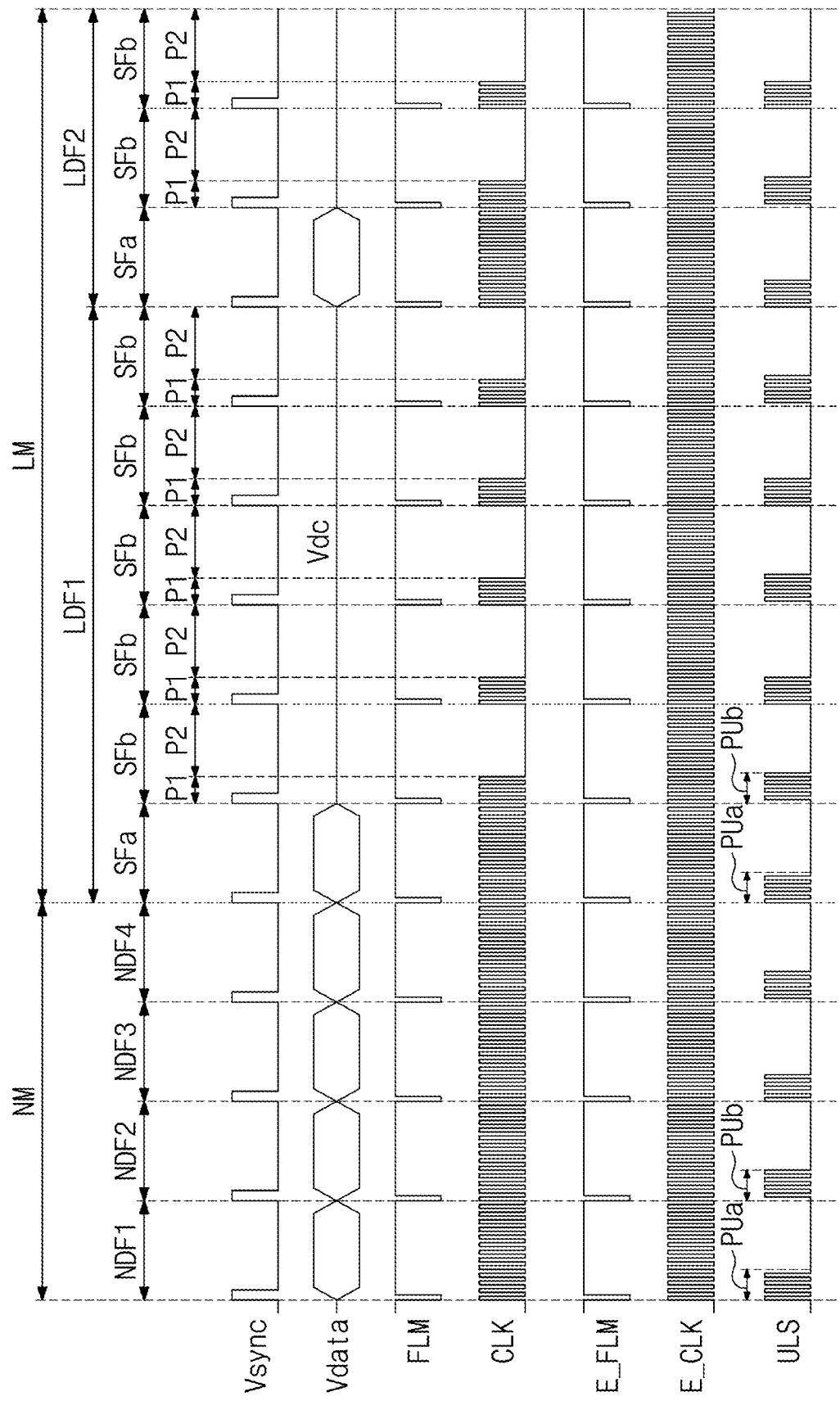
FIG. 16B is a waveform diagram illustrating a scan control signal, a light emitting control signal, and an uplink signal according to some embodiments of the present disclosure.

FIG. 16A is a waveform diagram illustrating a scan control signal, a light emitting control signal, and first and second uplink signals according to some embodiments of the present disclosure. FIG. 16B is a waveform diagram illustrating a scan control signal, a light emitting control signal, and an uplink signal according to some embodiments of the present disclosure.

Operations of a display panel 100 (refer to FIG. 6) and an input sensor 200 in a first driving mode NM in FIGS. 16A and 16B are duplicated with the contents described with reference to FIGS. 9A and 9B. Thus, a description of a detailed operation in the first driving mode NM will be omitted.

Referring to FIGS. 3, 6, and 16A, each of a plurality of second driving frames LDF1 and LDF2 may include a first sub-frame SFa and a plurality of second sub-frames SFb. The case where the second driving frame LDF1 includes five second sub-frames SFb is illustrated according to some embodiments of the present disclosure in FIG. 16A, but the number of second sub-frames SFb is not limited thereto, which may vary with a second operating frequency.

A data driver 100C3 (refer to FIG. 6) may apply a data signal Vdata (e.g., may be referred to as a "normal data signal" or a "valid data signal") including image information to the display panel 100 in the first sub-frame SFa. The data driver 100C3 may apply a data signal Vdc (e.g., may be referred to as a "black data signal" or a "bias data signal"), which does not include image information, to the display panel 100 during each second sub-frame SFb. The bias data signal Vdc may be a data signal having a black gray scale or a low gray scale.

In the second driving mode LM, the scan driver 100C2 (refer to FIG. 6) may be activated as a whole during the first sub-frame SFa and may be partially activated during each second sub-frame SFb. A scan control signal CONT1 provided to a scan driver 100C2 may include a scan start signal FLM and a scan clock signal CLK. The scan clock signal CLK may be activated as a whole in the first sub-frame SFa. Each second sub-frame SFb may include an active interval P1 and an inactive interval P2. The active interval P1 may be referred to as an interval where the scan clock signal CLK is activated. The inactive interval P2 may be referred to as an interval where the scan clock signal CLK is deactivated.

A light emitting driver 100C4 (refer to FIG. 6) may be activated as a whole during the first sub-frame SFa and the second sub-frame SFb. A light emitting control signal CONT3 provided to the light emitting driver 100C4 (refer to FIG. 6) may include a light emitting start signal E_FLM and a light emitting clock signal E_CLK. The light emitting driver 100C4 may be activated as a whole during the first sub-frame SFa and each second sub-frame SFb in the second driving mode LM.

Thus, an image corresponding to a bias data signal Vdc may be displayed on the display panel 100 as the scan driver 100C2 is activated in the active interval P1 of each second sub-frame SFb.

When the display panel 100 operates in the second driving mode LM, the sensor controller 200C may transmit a first uplink signal ULS1 and a second uplink signal ULS2 to the input sensor 200. An interval corresponding to a first interval PU1 where the first and second uplink signals ULS1 and ULS2 are transmitted may be included in the first sub-frame SFa. The first and second uplink signals ULS1 and ULS2 may be the same as signals provided to the input sensor 200 in the first driving mode NM.

Thus, the first and second uplink signals ULS1 and ULS2 may have inverted phases in the first interval PU1. For example, the second uplink signal ULS2 may be a signal, a phase of which is delayed by 180° from the first uplink signal ULS1.

A sensing area 200A of the input sensor 200 may include first and second areas AR1-1 and AR1-2 in the first sub-frame SFa of the second driving mode LM. The first uplink signal ULS1 may be provided to transmit electrodes (e.g., first to sixth transmit electrodes TE1 to TE6, refer to FIG. 15A) located in the first area AR1-1. The second uplink signal ULS2 may be provided to transmit electrodes (e.g., seventh to tenth transmit electrodes TE7 to TE10, refer to FIG. 15A) located in the second area AR1-2.

Meanwhile, the active interval P1 of each second sub-frame SFb of the second driving mode LM may be overlapped with the first interval PU1 and the inactive interval P2 may not be overlapped with the first interval PU1. In the active interval P1 of the first second sub-frame SFb of the second driving mode LM, the second uplink signal ULS2 may be provided to transmit electrodes (e.g., the first to sixth transmit electrodes TE1 to TE6, refer to FIG. 15B) located in the first area AR1-1. The first uplink signal ULS1 may be provided to transmit electrodes (e.g., the seventh to tenth transmit electrodes TE7 to TE10, refer to FIG. 15B) located in the second area AR1-2.

The first area AR1-1 and the second area AR1-2 may differ in area from each other in the second driving mode LM. An intensity of the first uplink signal ULS1 and an intensity of the second uplink signal ULS2 may be the same as or different from each other.

Each of the second driving frames LDF1 and LDF2 of the second driving mode LM may include an even number of sub-frames. When viewed from the two consecutive sub-frames SFa and SFb, the first and second uplink signals ULS1 and ULS2, each of which has an inverted phase, may be provided to the first area AR1-1 and the second and first uplink signals ULS2 and ULS1, each of which has an inverted phase, may be provided to the second area AR1-2. Thus, although a ripple is generated at the potential of the second electrode CE (refer to FIG. 5) due to parasitic capacitance Cb (refer to FIG. 5) between the input sensor 200 and the second electrode CE, when viewed from the two consecutive sub-frames SFa and SFb, an effect in which the ripple is offset may occur.

When the ripple generated at the potential of the second electrode CE is offset in a first charge cancellation scheme in the first driving mode NM, a ripple generated at the potential of the second electrode CE may also be offset in the first charge cancellation scheme in the second driving mode LM. In other words, as an active interval of each holding frame is included although the first driving mode NM switches to the second driving mode LM, the ripple generated at the potential of the second electrode CE may be offset by applying the same scheme as the first driving mode NM.

Thus, although the operating frequency of the display panel 100 changes, the ripple generated at the potential of the second electrode CE may be offset in the same scheme. As a result, a flicker due to parasitic capacitance Cb may be removed in the second driving mode LM and display quality of the display panel 100 may be relatively improved.

Referring to FIGS. 16b, 15C, and 15D, when the display panel 100 operates in the second driving mode LM, the sensor controller 200C may transmit the same uplink signal ULS as that in the first driving mode NM to the input sensor 200 during each of the second driving frames LDF1 and LDF2. Hereinafter, for convenience of description, an interval overlapped with odd-numbered first driving frames NDF1 and NDF3, the first sub-frame SFa, an odd-numbered second frame SFb in a first interval PU1 (refer to FIG. 7) where the uplink signal ULS is transmitted may be referred to as a first sub-interval PUa, and an interval overlapped with an even-numbered first driving frames NDF2 and NDF4 and the even-numbered second sub-frame SFb may be referred to as a second sub-interval PUb.

The phase of the uplink signal ULS in the first sub-interval PUa may be inverted from the phase of the uplink signal ULS in the second sub-interval PUb. In other words, the phase of the uplink signal ULS may be inverted in units of one first driving frame NDF1, NDF2, NDF3, or NDF4 in the first driving mode NM. The phase of the uplink signal ULS may be inverted in units of one sub-frame SFa or SFb in the second driving mode LM. Each second sub-frame SFb may include an active interval P1 and an inactive interval P2. The active interval P1 of each second sub-frame SFb may correspond to the first or second sub-interval PUa or PUb. For example, an active interval P1 of an odd-numbered second sub-frame SFb among the plurality of second sub-frames SFb may correspond to the second sub-interval PUb, and an active interval P1 of an even-numbered second sub-frame SFb may correspond to the first sub-interval PUa.

For example, the uplink signal ULS applied to the input sensor 200 during the first sub-frame SFa may have a phase delayed by 180° with the uplink signal ULS applied to the input sensor 200 during the first second sub-frame SFb. The sensor controller 200C may output an uplink signal ULS having a positive phase during the first sub-frame SFa and may output an uplink signal ULS having a reverse phase or a negative phase during an active interval P1 of the first second sub-frame SFb. The first and second sub-intervals PUa and PUb may be alternately arranged.

When the sensor controller 200C applies one uplink signal ULS to the input sensor 200, the sensing area 200A may fail to be divided into first and second areas.

In the first sub-frame SFa of the second driving mode LM, the uplink signal ULS having the positive phase may be provided to all transmit electrodes (e.g., first to tenth transmit electrodes TE1 to TE10, refer to FIG. 15C) located in the sensing area 200A. The uplink signal ULS having the reverse phase or the negative phase may be provided to all the transmit electrodes (e.g., the first to tenth transmit electrodes TE1 to TE10, refer to FIG. 15D) located in the sensing area 200A during the active interval P1 of the first second sub-frame SFb of the second driving mode SF.

When viewed from the two sub-frames SFa and SFb, an uplink signal ULS having an inverted phase may be provided to the sensing area 200A. Thus, although a ripple is generated at the potential of the second electrode CE (refer to FIG. 5) due to parasitic capacitance Cb (refer to FIG. 5) between the input sensor 200 and the second electrode CE, when viewed from the two sub-frames SFa and SFb, an effect in which the ripple is offset may occur. Thus, a flicker due to the parasitic capacitance Cb may be removed. As a result, display quality of the display panel 100 may be relatively improved in the second driving mode LM.

When the ripple generated at the potential of the second electrode CE is offset in a temporal averaging scheme in the first driving mode NM, a ripple generated at the potential of the second electrode CE may also be offset in the temporal averaging scheme in the second driving mode LM. In other words, when an even number of write frames are provided although the first driving mode NM switches to the second driving mode LM, the ripple generated at the potential of the second electrode CE may be offset by applying the same scheme as the first driving mode NM.

Thus, although the operating frequency of the display panel 100 changes, the ripple generated at the potential of the second electrode CE may be offset in the same scheme. As a result, a flicker due to parasitic capacitance Cb may be removed in the second driving mode LM and display quality of the display panel 100 may be relatively improved.

Figure 17A:
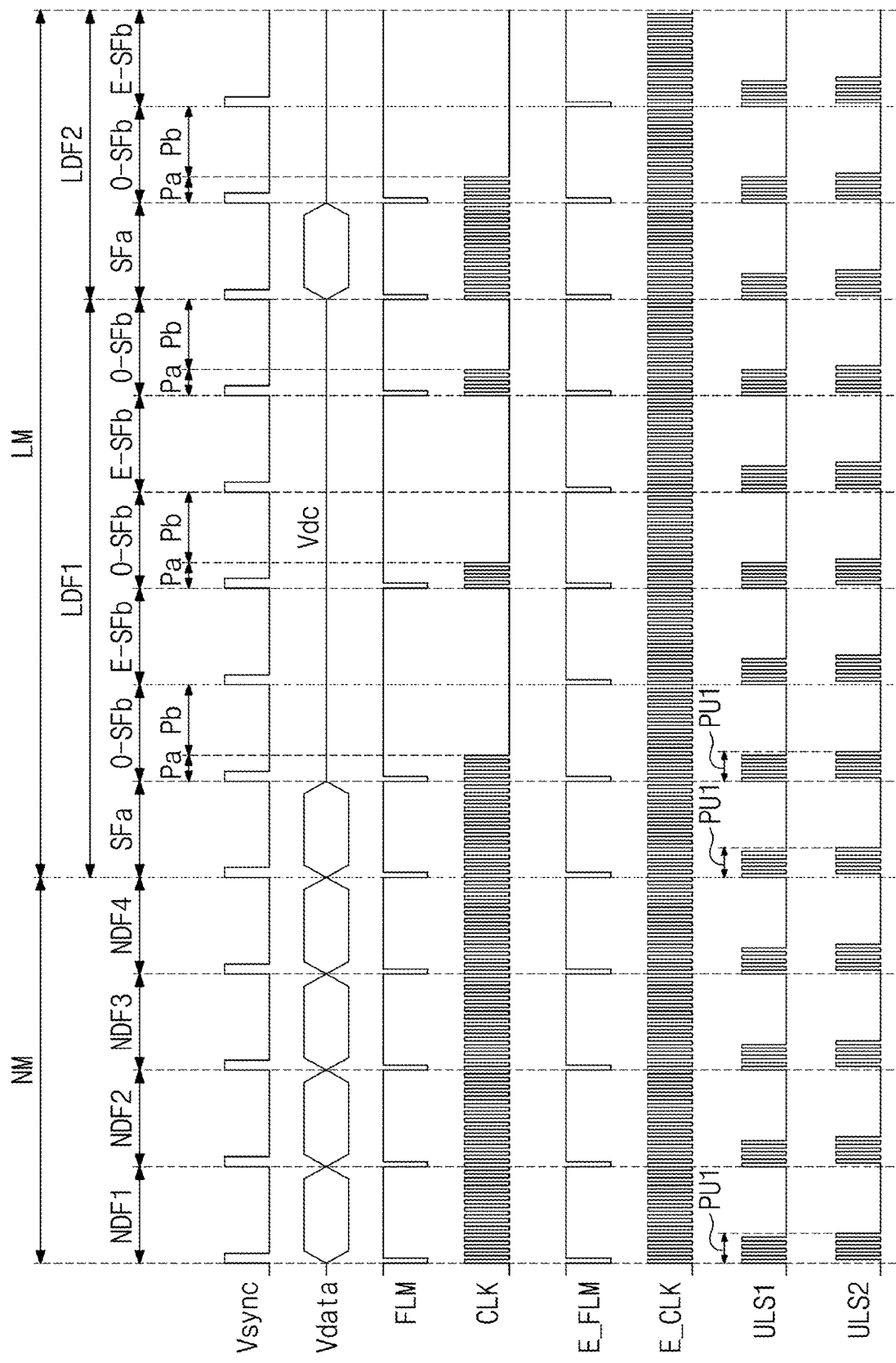
FIG. 17A is a waveform diagram illustrating a scan control signal, a light emitting control signal, and first and second uplink signals according to some embodiments of the present disclosure.
Figure 17B:
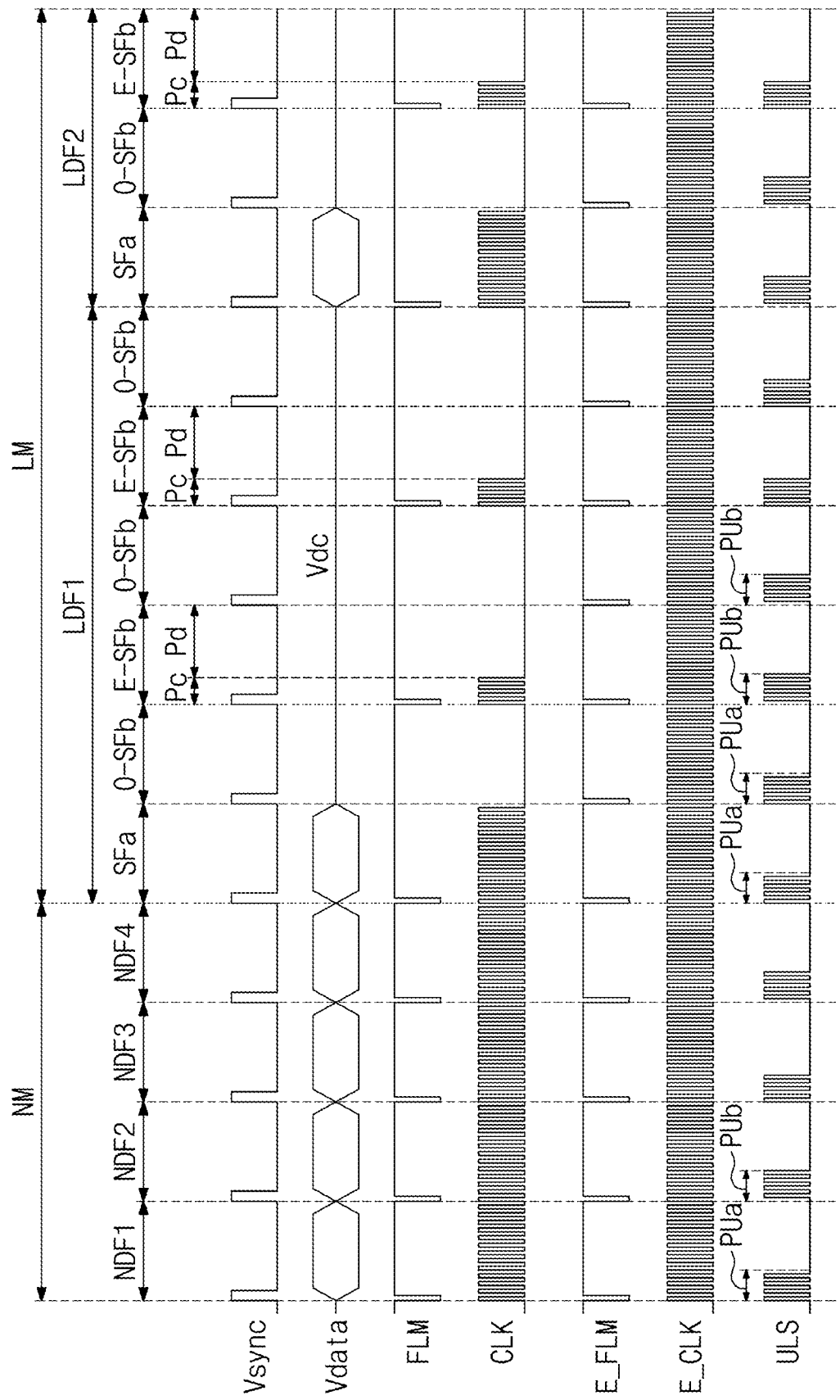
FIG. 17B is a waveform diagram illustrating a scan control signal, a light emitting control signal, and an uplink signal according to some embodiments of the present disclosure.

FIG. 17A is a waveform diagram illustrating a scan control signal, a light emitting control signal, and first and second uplink signals according to some embodiments of the present disclosure. FIG. 17B is a waveform diagram illustrating a scan control signal, a light emitting control signal, and an uplink signal according to some embodiments of the present disclosure.

Operations of a display panel 100 (refer to FIG. 6) and an input sensor 200 in a first driving mode NM in FIGS. 17A and 17B are duplicated with the contents described with reference to FIGS. 9A and 9B. Thus, a description of a detailed operation in the first driving mode NM will be omitted.

Referring to FIGS. 3, 6, and 17A, each of a plurality of second driving frames LDF1 and LDF2 may include a first sub-frame SFa and a plurality of second sub-frames O-SFb and E SFb.

In the second driving mode LM, a scan driver 100C2 may be activated as a whole during the first sub-frame SFa and may be partially activated during each of the second sub-frames O-SFb and E-SFb. A scan control signal CONT1 provided to the scan driver 100C2 may include a scan start signal FLM and a scan clock signal CLK. The scan clock signal CLK may be activated as a whole in the first sub-frame SFa. An odd-numbered second sub-frame O-SFb among the plurality of second sub-frames O-SFb and E-SFb may include an active interval Pa and an inactive interval Pb. The active interval Pa may be referred to as an interval where the scan clock signal CLK is activated. The inactive interval Pb may be referred to as an interval where the scan clock signal CLK is deactivated.

A light emitting driver 100C4 may be activated as a whole during the first sub-frame SFa and each of the second sub-frames O-SFb and E-SFb. A light emitting control signal CONT3 provided to the light emitting driver 100C4 may include a light emitting start signal E_FLM and a light emitting clock signal E_CLK. The light emitting driver 100C4 may be activated as a whole during the first sub-frame SFa and each of the second sub-frames O-SFb and E-SFb In the second driving mode LM.

Thus, an image corresponding to a bias data signal Vdc may be displayed on the display panel 100 as the scan driver 100C2 is activated in the active interval Pa of an odd-numbered second sub-frame O-SFb.

When the display panel 100 operates in the second driving mode LM, a sensor controller 200C may transmit a first uplink signal ULS1 and a second uplink signal ULS2 to the input sensor 200. An interval corresponding to a first interval PU1 where the first and second uplink signals ULS1 and ULS2 are transmitted may be included in the first sub-frame SFa. The first and second uplink signals ULS1 and ULS2 may be the same as signals provided to the input sensor 200 in the first driving mode NM.

The first and second uplink signals ULS1 and ULS2 may have inverted phases in the first interval PU1. For example, the second uplink signal ULS2 may be a signal, a phase of which is delayed by 180° from the first uplink signal ULS1.

A sensing area 200A of the input sensor 200 may include first and second areas AR1-1 and AR1-2 in the first sub-frame SFa of the second driving mode LM. The first uplink signal ULS1 may be provided to transmit electrodes (e.g., first to sixth transmit electrodes TE1 to TE6, refer to FIG. 15A) located in the first area AR1-1. The second uplink signal ULS2 may be provided to transmit electrodes (e.g., seventh to tenth transmit electrodes TE7 to TE10, refer to FIG. 15A) located in the second area AR2-1.

Meanwhile, the active interval Pa of an odd-numbered second sub-frame O-SFb of the second driving mode LM may be overlapped with the first interval PU1 and the inactive interval Pb may not be overlapped with the first interval PU1. In the active interval Pa of an odd-numbered second sub-frame O-SFb of the second driving mode LM, the second uplink signal ULS2 may be provided to transmit electrodes (e.g., the first to sixth transmit electrodes TE1 to TE6, refer to FIG. 15B) located in the first area AR1-1. The first uplink signal ULS1 may be provided to transmit electrodes (e.g., the seventh to tenth transmit electrodes TE7 to TE10, refer to FIG. 15B) located in the second area AR2-1.

The first area AR1-1 and the second area AR1-2 may differ in area from each other in the second driving mode LM. An intensity of the first uplink signal ULS1 and an intensity of the second uplink signal ULS2 may be the same as or different from each other.

When viewed from the two consecutive sub-frames SFa and O-SFb, the first and second uplink signals ULS1 and ULS1, each of which has an inverted phase, may be provided to the first area AR1-1 and the second and first uplink signals ULS2 and ULS1, each of which has an inverted phase, may be provided to the second area AR1-2. Thus, although a ripple is generated at the potential of the second electrode CE (refer to FIG. 5) due to parasitic capacitance Cb (refer to FIG. 5) between the input sensor 200 and the second electrode CE, when viewed from the two consecutive sub-frames SFa and O-SFb, an effect in which the ripple is offset may occur.

When the ripple generated at the potential of the second electrode CE is offset in a first charge cancellation scheme in the first driving mode NM, a ripple generated at the potential of the second electrode CE may also be offset in the first charge cancellation scheme in the second driving mode LM. In other words, as the scan driver 100C2 is activated during the active interval Pa of an odd-numbered second sub-frame O-SFB although the first driving mode LM switches to the second driving mode LM, the ripple generated at the potential of the second electrode CE may be offset by applying the same scheme as the first driving mode NM.

Thus, although the operating frequency of the display panel 100 changes, the ripple generated at the potential of the second electrode CE may be offset in the same scheme. As a result, a flicker due to parasitic capacitance Cb may be removed in the second driving mode LM and display quality of the display panel 100 may be relatively improved.

Referring to FIG. 17B, when the display panel 100 operates in the second driving mode LM, the sensor controller 200C may transmit the same uplink signal ULS as that in the first driving mode NM to the input sensor 200 during each of the second driving frames LDF1 and LDF2.

Each of the plurality of second driving frames LDF1 and LDF2 may include a first sub-frame SFa and a plurality of second sub-frames O-SFb and E-SFb.

In the second driving mode LM, a scan driver 100C2 may be activated as a whole during the first sub-frame SFa and may be partially activated during each of the second sub-frames O-SFb and E-SFb. A scan control signal CONT1 provided to the scan driver 100C2 may include a scan start signal FLM and a scan clock signal CLK. The scan clock signal CLK may be activated as a whole in the first sub-frame SFa. An even-numbered second sub-frame E-SFb among the plurality of second sub-frames O-SFb and E-SFb may include an active interval Pc and an inactive interval Pd. The active interval Pc may be referred to as an interval where the scan clock signal CLK is activated. The inactive interval Pd may be referred to as an interval where the scan clock signal CLK is deactivated.

The active interval Pc of an even-numbered second sub-frame E-SFb may correspond to the first or second sub-interval PUa or PUb. For example, the uplink signal ULS applied to the input sensor 200 during the first sub-frame SFa may have a phase delayed by 180° with the uplink signal ULS applied to the input sensor 200 during the active interval Pc of the even-numbered second sub-frame E-SFb. The sensor controller 200C may output an uplink signal ULS having a positive phase during the first sub-frame SFa and may output an uplink signal ULS having a reverse phase or a negative phase during the even-numbered second sub-frame E-SFb. The first and second sub-intervals PUa and PUb may be alternately arranged.

When the sensor controller 200C applies one uplink signal ULS to the input sensor 200, the sensing area 200A may fail to be divided into first and second areas.

In the first sub-frame SFa of the second driving mode LM, the uplink signal ULS having the positive phase may be provided to all transmit electrodes (e.g., first to tenth transmit electrodes TE1 to TE10, refer to FIG. 15C) located in the sensing area 200A. The uplink signal ULS having the reverse phase or the negative phase may be provided to all the transmit electrodes (e.g., the first to tenth transmit electrodes TE1 to TE10, refer to FIG. 15D) located in the sensing area 200A during the active interval Pc of the even-numbered second sub-frame E-SFb of the second driving mode LM.

When viewed from the two sub-frames SFa and E-SFb, an uplink signal ULS having an inverted phase may be provided to the sensing area 200A. Thus, although a ripple is generated at the potential of the second electrode CE (refer to FIG. 5) due to parasitic capacitance Cb (refer to FIG. 5) between the input sensor 200 and the second electrode CE, when viewed from the two sub-frames SFa and E-SFb, an effect in which the ripple is offset may occur. Thus, a flicker due to the parasitic capacitance Cb may be removed. As a result, display quality of the display panel 100 may be relatively improved in the second driving mode LM.

When the ripple generated at the potential of the second electrode CE is offset in a temporal averaging scheme in the first driving mode NM, a ripple generated at the potential of the second electrode CE may also be offset in the temporal averaging scheme in the second driving mode LM. In other words, when the scan driver 100C2 is activated during the active interval Pc of the even-numbered second sub-frame E-SFb although the first driving mode NM switches to the second driving mode LM, the ripple generated at the potential of the second electrode CE may be offset by applying the same scheme as the first driving mode NM.

Thus, although the operating frequency of the display panel 100 changes, the ripple generated at the potential of the second electrode CE may be offset in the same scheme. As a result, a flicker due to parasitic capacitance Cb may be removed in the second driving mode LM and display quality of the display panel 100 may be relatively improved.

According to some embodiments of the present disclosure, unlike a first charge cancellation scheme and a temporal averaging scheme, which remove the ripple on the basis of two first driving frames in the first driving mode, a scheme (i.e., a second charge cancellation scheme) capable of removing a ripple in one write frame in the second driving mode may be adopted. Thus, although the operating frequency of the display panel may be relatively low in the second driving mode, a ripple offset scheme may be changed and applied to the input sensor, thus stably removing a flicker phenomenon due to the uplink signal in the second driving mode. As a result, display quality may be relatively improved.

While the present disclosure has been described with reference to some embodiments thereof, it will be apparent to those of ordinary skill in the art that various changes and modifications may be made thereto without departing from the spirit and scope of the present disclosure as set forth in the following claims. Accordingly, the technical scope of the present disclosure should not be limited to the contents described in the detailed description of the specification, but should be defined by the appended claims, and their equivalents.

What is claimed is:

1. An electronic device, comprising:
    a display panel configured to display images;
    an input sensor on the display panel and configured to operate in a first mode to detect a first input by an input device or a second mode to detect a second input different from the first input;
    a panel driver configured to drive the display panel at a first operating frequency in a first driving mode and to drive the display panel at a second operating frequency lower than the first operating frequency in a second driving mode; and
    a sensor controller configured to control driving of the input sensor,
    wherein the display panel is configured to display the images in units of first driving frames in the first driving mode and displays the images in units of second driving frames in the second driving mode, and
    wherein the sensor controller is configured to transmit a first mode uplink signal for synchronization with the input device to the input sensor in a first scheme in the first driving mode and to transmit a second mode uplink signal for synchronization with the input device to the input sensor in a second scheme different from the first scheme in the second driving mode, wherein the second driving frames include a write frame and a holding frame, and wherein the sensor controller is configured to divide a sensing area into a third area and a fourth area during the write frame, to apply a third uplink signal to the third area, and to apply a fourth uplink signal having a reverse phase with the third uplink signal to the fourth area, the sensor controller is configured to apply a fifth uplink signal to an entire sensing area during the holding frame.

2. The electronic device of claim 1, wherein the input sensor includes the sensing area and a non-sensing area adjacent to the sensing area, and wherein the sensor controller is configured to divide the sensing area into a first area and a second area during an even-numbered first driving frame among the first driving frames, to apply a first uplink signal to the first area, to apply a second uplink signal having a reverse phase with the first uplink signal to the second area, to apply the second uplink signal to the first area during an odd-numbered first driving frame among the first driving frames, and to apply the first uplink signal to the second area.

3. The electronic device of claim 2, wherein the first area and the second area differ in area from each other.

4. The electronic device of claim 2, wherein an intensity of the first uplink signal and an intensity of the second uplink signal are different from each other.

5. The electronic device of claim 2, wherein the third area and the fourth area are a same size.

6. The electronic device of claim 5, wherein the first uplink signal has a same in intensity as the second uplink signal.

7. The electronic device of claim 2, wherein the panel driver includes:

a data driver configured to output data signals to the display panel; and a scan driver configured to output scan signals to the display panel, wherein the write frame is a frame where the data driver is configured to apply valid data signals to the display panel, and wherein the holding frame is a frame where the data driver is configured to apply bias data signals to the display panel.

8. The electronic device of claim 1, wherein the input sensor includes the sensing area and a non-sensing area adjacent to the sensing area, and wherein the sensor controller is configured to apply a first uplink signal having a positive phase to the sensing area during an odd-numbered first driving frame among the first driving frames and to apply a second uplink signal having a negative phase to the sensing area during an even-numbered first driving frame among the first driving frames.

9. The electronic device of claim 8, wherein the third area and the fourth area have a same size.

10. The electronic device of claim 9, wherein the first uplink signal has a same intensity as the second uplink signal.

11. An electronic device, comprising:

a display panel configured to display images;

an input sensor on the display panel and configured to operate in a first mode to detect a first input by an input device or a second mode to detect a second input different from the first input;

a panel driver configured to drive the display panel at a first operating frequency in a first driving mode and to drive the display panel at a second operating frequency lower than the first operating frequency in a second driving mode; and a sensor controller configured to control driving of the input sensor, wherein the display panel is configured to display the images in units of first driving frames in the first driving mode and to display the images in units of second driving frames in the second driving mode, wherein the second driving frames include k write frames and j holding frames, and wherein the k is an even number of 2 or more and the j is a natural number, the sensor controller is configured to apply an uplink signal having a positive phase during a first write frame among the k write frames and to apply an uplink signal having a negative phase during a second write frame among the k write frames.

12. The electronic device of claim 11, wherein the j is a number greater than the k.

13. The electronic device of claim 11, wherein the panel driver includes:

a data driver configured to output data signals to the display panel; and a scan driver configured to output scan signals to the display panel, wherein each of the k write frames is a frame where the data driver is configured to apply valid data signals to the display panel, and wherein each of the j holding frames is a frame where the data driver is configured to apply bias data signals to the display panel.

14. The electronic device of claim 13, wherein the scan driver is configured to be activated during the k write frames and is configured to be deactivated during the j holding frames.

15. The electronic device of claim 11, wherein the input sensor includes a sensing area and a non-sensing area adjacent to the sensing area, and wherein the sensor controller is configured to divide the sensing area into a first area and a second area during the first write frame among the k write frames, to apply a first uplink signal to the first area, to apply a second uplink signal having a reverse phase with the first uplink signal to the second area, and to apply the second uplink signal to the first area during the second write frame among the k write frames and applies the first uplink signal to the second area.

16. The electronic device of claim 15, wherein the first area and the second area differ in size from each other.

17. The electronic device of claim 11, wherein the input sensor includes a sensing area and a non-sensing area adjacent to the sensing area, and wherein the sensor controller is configured to apply the uplink signal having the positive phase to the sensing area during the first write frame among the k write frames and to apply the uplink signal having the negative phase to the sensing area during the second write frame among the k write frames.

18. An electronic device, comprising:

a display panel configured to display images at a first operating frequency in a first driving mode and to display the images at a second operating frequency lower than the first operating frequency in a second driving mode;

an input sensor on the display panel and configured to operate in a first mode to detect a first input by an input device or a second mode to detect a second input different from the first input;

a data driver configured to output data signals to the display panel;

a scan driver configured to output scan signals to the display panel; and a sensor controller configured to control driving of the input sensor and to transmit an uplink signal for synchronization with the input device during an uplink interval, wherein the display panel is configured to display the images in units of a first driving frame in the first driving mode and to display the images in units of a second driving frame in the second driving mode, wherein the second driving frame includes a write frame and j holding frames, the j is a natural number, and each of the j holding frames includes an active interval where the scan driver is activated and an inactive interval where the scan driver is deactivated, wherein the input sensor includes a sensing area and a non-sensing area adjacent to the sensing area, and wherein the sensor controller is configured to divide the sensing area into a first area and a second area during an odd-numbered holding frame among the j holding frames, to apply a first uplink signal to the first area, to apply a second uplink signal having a reverse phase with the first uplink signal to the second area, and to apply the second uplink signal to the first area during an even-numbered holding frame among the j holding frames and applies the first uplink signal to the second area.

19. The electronic device of claim 18, wherein the write frame is a frame where the data driver applies valid data signals to the display panel, and wherein each of the j holding frames is a frame where the data driver applies bias data signals to the display panel.

20. The electronic device of claim 19, wherein the active interval is overlapped with an uplink interval where the uplink signal is transmitted to the input sensor, and the inactive interval is not overlapped with the uplink interval.

21. The electronic device of claim 18, wherein the first area and the second area differ in size from each other.

22. The electronic device of claim 18, wherein the odd-numbered holding frame or the even-numbered holding frame among the j holding frames includes the active interval and the inactive interval.

* * * * *